(12) United States Patent
Chen et al.

(10) Patent No.: US 11,779,946 B2
(45) Date of Patent: Oct. 10, 2023

(54) SYSTEM AND METHOD FOR QUALITY INSPECTION ON OVERALL INKJET PRINTING MANUFACTURING PROCESS FOR DISPLAY DEVICE

(71) Applicant: HUAZHONG UNIVERSITY OF SCIENCE AND TECHNOLOGY, Hubei (CN)

(72) Inventors: Jiankui Chen, Hubei (CN); Zhouping Yin, Hubei (CN); Qiangqiang Liu, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 179 days.

(21) Appl. No.: 17/209,138

(22) Filed: Mar. 22, 2021

(65) Prior Publication Data

US 2022/0203700 A1 Jun. 30, 2022

(30) Foreign Application Priority Data

Dec. 30, 2020 (CN) .......................... 202011622486.4

(51) Int. Cl.
*B41J 2/21* (2006.01)
*B05B 12/08* (2006.01)
*G06T 7/00* (2017.01)
*H01L 21/67* (2006.01)
*B05D 1/02* (2006.01)

(52) U.S. Cl.
CPC .......... *B05B 12/084* (2013.01); *B05B 12/082* (2013.01); *B05D 1/02* (2013.01); *G06T 7/0004* (2013.01); *H01L 21/67253* (2013.01)

(58) Field of Classification Search
CPC ...................................................... B05D 1/02
See application file for complete search history.

(56) References Cited

U.S. PATENT DOCUMENTS

| | | | |
|---|---|---|---|
| 2007/0222809 A1* | 9/2007 | Ooshiro | B41J 29/393 347/19 |
| 2017/0165708 A1* | 6/2017 | Sivaramakrishnan | C23C 16/44 |

FOREIGN PATENT DOCUMENTS

CN 111397539 * 7/2020

* cited by examiner

*Primary Examiner* — Nathan T Leong
(74) *Attorney, Agent, or Firm* — JCIP GLOBAL INC.

(57) ABSTRACT

The disclosure discloses a system for quality inspection in the entire process of inkjet printing manufacturing of display devices, which includes a substrate inspection module, a nozzle inspection module, an ink droplet inspection module, a coating thickness inspection module and a control module. Through design and matching of these modules, it is possible to realize a series of operations such as substrate inspection, nozzle inspection, flying ink droplet inspection, liquid coating inspection and cured coating inspection. The invention also discloses a corresponding quality inspection method for the entire inkjet printing manufacturing process for display devices. The invention effectively compensates for the shortcomings of current technology which only inspect a single stage without taking the whole process into consideration, thereby realizing high-precision quality inspection of each stage in the inkjet printing manufacturing process of display devices, and significantly improving the quality and yield of the display device product.

8 Claims, 16 Drawing Sheets

SYSTEM AND METHOD FOR QUALITY INSPECTION ON OVERALL INKJET PRINTING MANUFACTURING PROCESS FOR DISPLAY DEVICE

CROSS-REFERENCE TO RELATED APPLICATION

This application claims the priority benefit of China application serial no. 202011622486.4, filed on Dec. 30, 2020. The entirety of the above-mentioned patent application is hereby incorporated by reference herein and made a part of this specification.

TECHNICAL FIELD

The disclosure relates to the field of inkjet printing manufacturing technology, and more specifically, relates to a system and method for quality inspection on the entire inkjet printing manufacturing process for display devices.

BACKGROUND

New display devices are developed towards a trend of ultra-high resolution, large size, slimness, flexibility, and low cost. There are problems in conventional vacuum coating-based display manufacturing technology such as complex preparation process, high cost, and high energy consumption. Piezoelectric inkjet and electrohydrodynamic inkjet technology are the mainstream printing and display technologies, which are not only high-precision patterning manufacturing technologies, but also have significant characteristics such as low cost, flexibility, and large-scale production. Therefore, such technologies provide an important direction for future development of new display industry.

At present, a key problem encountered by inkjet printing technology used in manufacturing display devices is how to reduce printing defects and improve the yield of display devices. Specifically, in the process of inkjet printing manufacturing various display devices, especially new display devices, multiple technical problems such as substrate defects, nozzle defects, and abnormal ink droplets might cause the inkjet printed devices to have defects in liquid coating and cured coating stages, which consequently leads to the defect of display devices. Correspondingly, there is a need to carry out quality inspection on all aspects of inkjet printing manufacturing, and improve the inkjet printing quality through closed-loop feedback control.

Current technologies have provided some technical solutions for inspecting defects in the inkjet printing process, but basically such technologies only focus on a stage of the inkjet printing process instead of forming a systematic and comprehensive design, and the relationship between every stage of the process is not taken into consideration. Or the object inspection and implementation technology are not well developed, and therefore there is no proper and comprehensive defect controlling solution provided for the overall inkjet printing process. For example, regarding the technical solution for inspecting defects of glass substrate in known technologies, the inspection focuses on the substrate itself without taking into the impact caused by the defect of substrate on the quality of inkjet printing in the subsequent process. Known technologies for inspection of nozzle only focuses on the positioning problem of nozzle without paying attention to inspection of manufacturing defect of nozzle and residual of ink, not to mention the technical means of deducing nozzle defect according to the defect of inkjet printing. Current ink droplet inspection technologies are mostly carried out from a single viewing angle, and therefore the scope of parameters for measurement is not comprehensive enough and so on.

Additionally, there are few inspection solutions for inkjet printing coating. Generally, there are inspection solutions provided for cured coating, but they do not involve defining liquid coating defect and defect inspection algorithms and related liquid coating solutions. For inspection on cured coating, currently known inspection solutions in this regard typically perform photographing through camera capturing and it is difficult to correctly measure the coating thickness and volume. Currently white light interference technology can only be performed in an off-line measurement mode which cannot measure thickness of liquid coating and cured coating on-line. In known technologies for inspection of liquid coating and cured coating, there are no solutions for reducing defects by modulating the former stage of the process through closed-loop control.

Correspondingly, the solution to effectively performing a comprehensive on-line inspection on the whole inkjet printing manufacturing process, so as to achieve high-precision inspection on the quality of the whole inkjet printing manufacturing process for display devices while taking into the inspection results of all stages of the printing manufacturing process into consideration to perform systematic quality control is now the key technology urgently demanded in the field.

SUMMARY

To overcome the defect in current technologies or meet the technical requirement, the purpose of the disclosure is to provide a system and method for quality inspection on the entire inkjet printing manufacturing process for display devices. On one hand, a brand new design is made to the key constitution module structure and its operation method for quality inspection on the entire process, which can effectively realize a comprehensive and systematic quality inspection on a series of operations, including substrate inspection, nozzle inspection, flying ink droplet inspection, liquid coating inspection and cured coating inspection and so on, thereby compensating for the shortcoming of current technologies which only perform inspection on a single part instead of the entire process. On the other hand, the disclosure further studies and improves the inspection algorithms and operation steps of all inspection details, and forms an inspection and control closed-loop in the entire inkjet printing manufacturing process, correspondingly it is possible to achieve improved quality inspection and modulation with higher precision. The yield rate of display device products can be significantly improved, and therefore the disclosure is especially suitable for manufacturing various new types of display devices with ultra-high resolution, large size, slimness and flexibility.

Correspondingly, according to an aspect of the disclosure, there is provided a system for quality inspection on the overall printing manufacturing process for display devices, characterized in that the system includes a substrate inspection module, a nozzle inspection module, an ink droplet inspection module, a coating thickness inspection module and a control module.

The substrate inspection module includes a large-field downward-view unit (12), a high-magnification downward-view unit (13) and a high-resolution vision unit (11), wherein the large-field downward-view unit (12) and the high-magnification downward-view unit (13) are all arranged on a first moving part with $Y_2$ and $Z_2$ degrees of freedom, that is, the second horizontal longitudinal degree of freedom, and the second vertical degree of freedom, and are respectively configured for performing coarse positioning inspection and fine positioning inspection on the substrate before inkjet printing. The high-resolution vision unit (11) is arranged on a second moving part with $Y_1$ and $Z_1$ degrees of freedom, that is, the first horizontal longitudinal degree of freedom, and the first vertical degree of freedom, and is configured for performing visual quality inspection on the substrate before inkjet printing, liquid coating or cured coating sprayed onto the substrate.

The nozzle inspection module includes a large-field upward-view unit (21) and a high-magnification upward-view unit (22), wherein the large-field upward-view unit (21) and the high-magnification upward-view unit (22) are all arranged on a third moving part with $X_1$ degree of freedom, that is, the first horizontal degree of freedom, and are respectively configured for performing positioning inspection and visual quality inspection on the print head used for performing inkjet printing.

The ink droplet inspection module includes two sets of horizontal vision units arranged at an angle α. The two sets of horizontal vision units work synchronously to form a binocular vision system, which is arranged on a fourth moving part with $X_2$ degrees of freedom, that is, the second horizontal degree of freedom, and is configured for performing real-time visual inspection on the volume, velocity, angle and shape of the flying ink droplet sprayed by the print head.

The coating thickness inspection module includes a set of white light interference vision unit, which is arranged in the same way as the high-resolution vision unit (11) on the second moving part with $Y_1$ and $Z_1$ degrees of freedom, that is, the first horizontal longitudinal degree of freedom and the first vertical degree of freedom, and is configured for performing real-time visual inspection on the coating thickness, volume and uniformity of the ink sprayed onto the substrate before and after curing.

The control module includes a real-time processing controller (32), a movement controller (31), a synchronous trigger control card (33), and an inkjet control card (34), wherein the movement controller (31) is connected to the substrate inspection module, the nozzle inspection module, the ink droplet inspection module and the coating thickness inspection module respectively, controlling the movement of these modules and obtaining position feedback information. The inkjet control card (34) is configured to control the on/off of the nozzle and set the driving waveform, thereby controlling the nozzle to spray and output a triggering signal to the synchronous trigger control card (33). The synchronous trigger control card (33) receives the triggering signal and delays triggering the operation of the ink droplet inspection module, thereby performing a real-time inspection on the volume, velocity, angle and shape of the flying ink droplet. The real-time processing controller (32) is connected to the substrate inspection module, the nozzle inspection module, the ink droplet inspection module and the coating thickness inspection module respectively, thereby controlling the above modules to work and obtain corresponding image data for processing, so as to obtain multiple inspection results including substrate defects, nozzle defects, liquid coating defects, and cured coating defects. In addition, the real-time processing controller (32) is also connected to the movement controller (31), the synchronous trigger control card (33) and the inkjet control card (34) respectively, forming a closed-loop control on the entire inkjet printing manufacturing process of the display device.

More preferably, for the substrate inspection module, its large-field downward-view unit (12) and high-magnification downward-view unit (13) are both provided with a camera, a lens and a coaxial point light source, and the large-field downward-view unit (12) is preferably arranged on the print head module of the inkjet printing device.

More preferably, for the nozzle inspection module, its large-field upward-view unit (21) and high-magnification upward-view unit (22) are both provided with a camera, a lens and a coaxial point light source, and the nozzle inspection module is preferably arranged at the substrate absorbing platform.

More preferably, for the ink droplet inspection module, its two sets of horizontal vision units are each preferably configured with a coaxially arranged camera, a lens, a collimator lens and a light source, and four reflectors can be added as required. Together they form the reflector set with a periscope optical path.

More preferably, for the coating thickness inspection module, its white light interference vision unit is preferably provided with a camera, a lens, a coaxial point light source and an interference object lens. In the meantime, a grating ruler preferably with sub-micron resolution is added as a position feedback device to the $Z_1$ degree of freedom, that is, the first vertical degree of freedom.

According to another aspect of the disclosure, a corresponding quality inspection method is also provided, which is characterized in that the method includes the following steps:

(a) Use a substrate inspection module to perform positioning inspection and visual quality inspection on the substrate before inkjet printing, and record and establish a substrate defect feature database and a substrate defect distribution map.

(b) Use a nozzle inspection module to perform positioning inspection and visual quality inspection on the print head, and record and establish a nozzle defect feature database.

(c) Use an ink droplet inspection module to perform real-time visual inspection on the volume, velocity, angle and shape of the flying ink droplet that is sprayed by the print head, and record and establish an ink droplet parameter feature database.

(d) Use a substrate inspection module and the coating thickness inspection module to perform visual inspection on the quality of the liquid coating and the thickness of the liquid coating sprayed onto the substrate, and record and establish a liquid coating defect feature database and a liquid coating defect distribution map.

(e) Use the substrate inspection module and the coating thickness inspection module again to perform visual inspection on the quality of the cured coating and the thickness of the cured coating that are sprayed onto the substrate and completely cured, and record and establish a cured coating defect feature database and a cured coating defect distribution map.

(f) Set defect determining criteria for the substrate, the nozzle, the ink droplets, the liquid coating, and the cured coating in advance, and form an inspection closed-loop between the nozzle and the ink droplet as well as an inspection closed-loop between the substrate, the nozzle, the ink droplet, the liquid coating and the cured coating according to the multiple defect feature databases and parameter feature databases respectively formed in the above steps. Then, deduce and determine the specific source of defect based on the cured coating defect and perform the corresponding optimal modulation. In this way, the quality closed-loop feedback control of the entire inkjet printing manufacturing process is realized.

More preferably, for the above step (a), the step preferably includes the following operating procedures:

(a1) Activate substrate inspection module, use the large-field downward-view unit (12) first to find at least 2 positioning marks on the substrate, and then switch the large-field downward-view unit (12) to the high-magnification downward-view unit (13) for performing position inspection on the positioning marks, thereby calculating the installation position and tilt angle of the substrate.

(a2) The substrate moves sequentially to the preset marked position along the direction $X_1$, that is, the first horizontal lateral direction. In the meantime, the high-resolution vision unit (11) collects images of the substrate. After the movement in the direction $X_1$ is completed, the high-resolution vision unit (11) moves for a predetermined distance along the direction $Y_1$, that is, the first horizontal longitudinal direction, and then the substrate moves reversely in the direction $X_1$. In this way, the substrate and the high-resolution vision unit (11) move alternately until the image of the entire substrate is collected. In the process, it is ensured that there is a certain overlap area in adjacent images obtained from each collecting.

(a3) Obtain a complete substrate image by stitching the adjacent images, and image processing is performed on the image to establish the substrate defect feature database and the substrate defect distribution map. Then the substrate defect determining index $C_b$ is calculated according to the following formula (1), wherein when $C_b$ is greater than the preset threshold $C_{b0}$, it is determined that the substrate is a defective substrate.

$$C_b = \sum_{i=1}^{N} b_i \left( \sum_{j=1}^{N_i} \left( \frac{D_j}{T_i} - 1 \right) \right) \quad \text{formula (1)}$$

In the formula (1), N represents the number of defect categories of the substrate; $T_i$, $N_i$, $b_i$ respectively represent the threshold for determining the defect, the number of defects and weighting coefficient in the i-th category; $D_j$ represents the measured defect feature parameter and $D_j > T_i$; i and j respectively represent integers of 1~N and 1~$N_i$.

More preferably, for the above step (b), the step preferably further includes the following operation steps:

(b1) Activate nozzle inspection module, use the large-field upward-view unit (21) first to find at least 2 positioning marks of the print head. Then, switch the large-field upward-view unit (21) to the high-magnification upward-view unit (22) for performing position inspection on the positioning marks, thereby calculating the initial position of the nozzle.

(b2) The high-magnification upward-view unit (22) collects an image of each nozzle area and obtains nozzle contour information including contour points. Then measure the nozzle size and calculate the nozzle defect index $C_n$ according to the following formula (2), wherein when $C_n$ is greater than the preset threshold $C_0$, it is determined that the nozzle is defective.

$$C_n = \gamma_1 \frac{1}{N} \sum_{i=1}^{N} \left| \sqrt{(x_i - x_0)^2 + (y_i - y_0)^2} - r \right| + \quad \text{formula (2)}$$

$$\gamma_2 \left( \max\left(\sqrt{(x - x_0)^2 + (y - y_0)^2}\right) - \min\left(\sqrt{(x - x_0)^2 + (y - y_0)^2}\right) \right)$$

In formula (2), N represents the number of contour points, $x_i$ and $y_i$ respectively represent the position coordinates of the contour point numbered i, and the value of i is an integer from 1 to N; $\gamma 1$ and $\gamma 2$ are preset weighting coefficients respectively; $x_0$ and $y_0$ respectively represent the position coordinates of the center point of the nozzle; x and y respectively represent the position coordinates of any one of the multiple contour points; r represents the radius of the circle corresponding to the nozzle.

More preferably, for the above step (c), the step preferably includes the following operating procedures:

(c1) Activate ink droplet inspection module, and synchronously trigger the two sets of horizontal vision units to collect images of flying ink droplets at multiple timings in a strobe mode, until the inspection on flying ink droplet from all nozzles is completed.

(c2) Perform stereo calibration and image processing on the image of the flying ink droplets, then classify the shapes of the ink droplets, and simultaneously measure a series of ink droplet parameters such as volume, velocity, and angle. Furthermore, calculate the ink droplet defect index $C_d$ according to the following formula (3), wherein when $C_d$ is greater than the preset threshold $C_{d0}$, it is determined that the ink droplet is a defective ink droplet.

$$C_d = d_1 \left| \frac{V}{V_0} - 1 \right| + d_2 \left| \frac{v}{v_0} - 1 \right| + d_3 \left| \frac{\varphi}{\varphi_0} - 1 \right| + d_4 \left| \frac{\theta}{\theta_0} - 1 \right| \quad \text{formula (3)}$$

In formula (3), $V_0$, $v_0$, $\varphi_0$, and $\theta_0$ respectively represent the preset ink droplet volume threshold, velocity threshold, and two angle thresholds; $d_1$, $d_2$, $d_3$, and $d_4$ respectively represent the preset weighting coefficients; V represents the actually measured volume of the flying ink droplet, v represents the actually measured velocity of the flying ink droplet; $\varphi$ and $\theta$ represent the actually measured azimuth and pitch angle of the flying ink droplet.

More preferably, in sub-step (c2), the actual volume V of the flying ink droplet is preferably measured through the following process:

For the images of flying ink droplets respectively obtained by the two sets of horizontal vision units, align the two contours in height, and use the 3rd order Hermite curve interpolation to construct the closed curve represented by the following formula (4) according to the four contour points in the same height plane.

Then the enclosed area S of the constructed closed curve is calculated, and the actual volume V of the flying ink droplet is calculated according to the following formulas (5) and (6) through the volume integration method.

$$H(x) = \quad \text{formula (4)}$$

$$y_1 \left( 1 + 2 \frac{x - x_1}{x_2 - x_1} \right) \left( \frac{x - x_2}{x_1 - x_2} \right)^2 + y_2 \left( 1 + 2 \frac{x - x_2}{x_1 - x_2} \right) \left( \frac{x - x_1}{x_2 - x_1} \right)^2 +$$

$$S = -k_1 \int_{x_1}^{x_2} H_1(x)dx - \begin{array}{c} y_1'(x-x_1)\left(\dfrac{x-x_2}{x_1-x_2}\right)^2 + y_2'(x-x_2)\left(\dfrac{x-x_1}{x_2-x_1}\right)^2 \end{array} \quad \text{formula (5)}$$

$$k_2 \int_{x_2}^{x_3} H_2(x)dx + k_3 \int_{x_3}^{x_4} H_3(x)dx + k_4 \int_{x_4}^{x_1} H_4(x)dx$$

$$V = \Delta h \sum S_i \quad \text{formula (6)}$$

In the formulas, H(x) represents the structure curve between two contour points, and four segments of curves $H_1$, $H_2$, $H_3$, and $H_4$ are constructed between the four contour points in the same height plane; $(x_1, y_1)$ and $(x_2, y_2)$ respectively represent the coordinate values of the two adjacent contour points that construct the Hermite curve; $y_1'$ and $y_2'$ respectively represent the derivatives at the point $(x_1, y_1)$ and $(x_2, y_2)$; $k_1$, $k_2$, $k_3$, $k_4$ respectively represent the correction coefficient for correcting the error of the ink droplet contour approximately represented by the Hermite curve; $\Delta h$ represents the height between the adjacent height planes; $S_i$ represents the area enclosed by the closed curve in the i-th height plane.

More preferably, for the above step (d), the step preferably includes the following operating procedures:

(d1) Sequentially move the substrate after inkjet printing to the preset marked position according to the position feedback along the direction $X_1$, that is, the first horizontal lateral direction. In the meantime, the high-resolution vision unit (11) collects the image of the current substrate. After the movement in the direction $X_1$ is completed, the high-resolution vision unit (11) moves for a preset distance along the direction $Y_1$, that is, the first horizontal longitudinal direction, and then the substrate moves reversely in the direction $X_1$. In this manner, the high-resolution vision unit (11) and the substrate move alternately until the image of the liquid coating is completely collected. In this process, it should be ensured that there is a certain overlap area in the adjacent images obtained from each image collection.

(d2) Obtain a complete liquid coating substrate image by stitching adjacent images, perform background subtraction and image processing on the obtained image, and establish a liquid coating defect feature database and a liquid coating defect distribution map.

(d3) Activate coating thickness inspection module to perform scanning along the direction $Z_1$, that is, the first vertical direction, so as collect a series of interference fringe images at each height position and record the corresponding vertical position value. Calculate the liquid coating thickness distribution and liquid coating volume according to the white light interference principle.

(d4) Calculate the local uniformity index $U_{local}$ of the liquid coating and the global uniformity index $U_{global}$ of the liquid coating according to the following formulas (7) and (8), and the inkjet printing quality is assessed based on these two indexes.

$$U_{local} = \frac{S_h}{S_{local}} \quad \text{formula (7)}$$

$$U_{global} = \frac{1}{K}\sum_{k=1}^{K} U_k, \quad U_k = \begin{cases} 0, & \dfrac{|h_{c,k}-\bar{h}|}{\bar{h}} > \lambda_2 \\ U_k, & \dfrac{|h_{c,k}-\bar{h}|}{\bar{h}} \leq \lambda_2 \end{cases} \quad \text{formula (8)}$$

In the above formulas, $S_{local}$ represents the area of the defined region of interest of the liquid coating substrate inspection image; $S_h$ represents the area of the region of which the thickness h satisfies $$\frac{|h-h_c|}{h_c} \leq \lambda_1$$

and which begins to be searched from the center of the region of interest, wherein $h_c$ represents the center thickness of the region of interest. $\lambda_1$ represents the preset local uniformity coefficient of the liquid coating, $\lambda_2$ represents the preset global uniformity coefficient of the liquid coating; K represents the number of regions of interest determined by sampling when calculating the global uniformity; $h_{c,k}$ and $U_k$ respectively represent the central thickness and local uniformity of the k-th region of interest, wherein the value of k is an integer from 1 to K; $\bar{h}$ represents the average value of the center thickness of the liquid coating of the K regions of interest.

More preferably, for the above step (e), the step preferably includes the following operation steps:

(e1) Sequentially move the substrate after inkjet printing and curing to the preset marked position according to the position feedback along the direction $X_1$, that is, the first horizontal lateral direction. In the meantime, the high-resolution vision unit (11) collects the image of the current substrate. After the movement in the direction $X_1$ is completed, the high-resolution vision unit (11) moves for a preset distance along the direction $Y_1$, that is, the first horizontal longitudinal direction, and then the substrate moves reversely in the direction $X_1$. In this manner, the high-resolution vision unit (11) and the substrate move alternately until the image of the cured coating is completely collected. In this process, it should be ensured that there is a certain overlap area in the adjacent images obtained from each image collection.

(e2) Obtain a complete cured coating substrate image by stitching adjacent images, perform background subtraction on the obtained image, and establish a cured coating defect feature database and a cured coating defect distribution map.

(e3) Activate the coating thickness inspection module to perform scanning along the direction $Z_1$, that is, the first vertical direction, so as collect a series of interference fringe images at each height position and record the corresponding vertical position value. Calculate the cured coating thickness distribution and cured coating volume according to the white light interference principle.

(e4) Calculate local uniformity index $U_{local}$ of the cured coating and the global uniformity index $U_{global}$ of the cured coating according to the following formulas (9) and (10), and the quality after inkjet printing curing is assessed based on these two indexes.

$$U_{local} = \frac{S_h}{S_{local}} \quad \text{formula (9)}$$

$$U_{global} = \frac{1}{K}\sum_{k=1}^{K} U_k, \quad U_k = \begin{cases} 0, & \frac{|h_{c,k}-\overline{h}|}{\overline{h}} > \mu_2 \\ U_k, & \frac{|h_{c,k}-\overline{h}|}{\overline{h}} \le \mu_2 \end{cases} \quad \text{formula (10)}$$

In the above formulas, $S_{local}$ represents the area of the defined region of interest of the cured coating substrate inspection image; $S_h$ represents the area of the region of which the thickness h satisfies $$\frac{|h-h_c|}{h_c} \le \mu_1$$

and which begins to be searched from the center of the region of interest, wherein $h_c$ represents the center thickness of the region of interest. $\mu_1$ represents the preset local uniformity coefficient of the cured coating, $\mu_2$ represents the preset global uniformity coefficient of the cured coating; K represents the number of regions of interest determined by sampling when calculating the global uniformity; $h_{c,k}$ and $U_k$ respectively represent the central thickness and local uniformity of the k-th region of interest, wherein the value of k is an integer from 1 to K; $\overline{h}$ represents the average value of the center thickness of the cured coating of the K regions of interest.

More preferably, for the above step (f), the step of forming the inspection closed-loop between the nozzle and the ink droplet preferably includes the following operation steps:

Compare the nozzle defect feature database and the ink droplet parameter feature database, determine the impact of the nozzle defect on the ink droplet defect, and shut down the nozzle that cannot be used normally due to the nozzle defect.

Specifically, the criteria for determining the impact of the nozzle defect on the ink droplet defect are set as follows. If a nozzle and its sprayed ink droplets are not defective, it is determined that the nozzle can be used normally; if a nozzle is defective but its sprayed ink droplets are not defective, it is determined that the nozzle defect does not cause ink droplet defects, and the nozzle can be used normally; if the ink droplets sprayed by a nozzle are defective, the driving waveform is modulated and the ink droplet inspection is performed again. Under the circumstances, if the droplets are not defective, it is determined that the nozzle itself does not cause ink droplet defects and can be used normally, otherwise it is determined the nozzle defect is unacceptable and the defective nozzle is shut down.

More preferably, for the above step (f), the step of forming the closed-loop for inspection between the substrate, the nozzle, the ink droplets, the liquid coating and the cured coating preferably includes the following operation steps:

For the collected substrate defect feature database, the nozzle defect feature database, the ink droplet parameter feature database, the liquid coating defect feature database and the cured coating defect feature database, these feature databases are compared to determine the source of the defects, and then the criteria for determining the substrate defects, the nozzle defects, the ink droplet defects, and the liquid coating defects are adjusted accordingly.

Specifically, the operation of determining the source of the defect and adjusting the determining criteria accordingly is as follows. The liquid coating defect feature database and the cured coating defect feature database are compared. If there is no liquid coating defect at the cured coating defect, then it is determined that the defect originates from the curing process or the criteria for determining the liquid coating defects need to be set to a lower level. If there is a liquid coating defect, the inkjet printing process is further analyzed, and the nozzles that are involved in printing the pixel having the cured coating defect are searched.

The substrate defect feature database and the liquid coating defect feature database are compared. If there is a substrate defect at the liquid coating defect, the impact of the substrate defect on the liquid coating defect is further investigated. If the substrate defect will cause the liquid coating defect, the threshold $C_{b0}$ for determining the substrate defect is set to be lower. If there is no substrate defect, it is determined that the defect originates from the spraying process or the criteria for determining the substrate defect needs to be set to a lower level, and the spraying process is further analyzed.

The ink droplet parameter feature database is checked. If the ink droplets sprayed by the nozzle involved in printing the defective pixels are not defective, the threshold $C_{d0}$ for determining the ink droplet defects needs to be set to a lower level, otherwise the nozzle and ink droplet inspection closed-loop method are adopted to determine whether the defects originate from the nozzle. If the defect originates from a nozzle but the nozzle is not defective in the nozzle defect feature database, the threshold $C_{n0}$ for determining the nozzle defect is set to a lower level.

More preferably, for the above step (f), the step of forming the quality closed-loop feedback control of the entire ink printing manufacturing process preferably adopts the following method:

The driving waveform is set to control the nozzle to spray, the criteria for determining the defects of the substrate, the nozzle, the ink droplets, the liquid coating, and cured coating are set and corresponding quality inspection is performed. The source of defects is deduced according to the nozzle, the ink droplet inspection closed-loop as well as the substrate, the nozzle, the ink droplet, the liquid coating and the cured coating inspection closed-loop, and the defect determining criteria in the corresponding stage are adjusted to reduce the missed inspection rate and false inspection rate of the defects. If the cured coating defect is caused by the nozzle defect, the defective nozzle is shut down; if the cured coating defect is caused by the driving waveform, the driving form is adjusted.

More preferably, the display device is preferably a new type of display device with ultra-high resolution, large size, slimness and flexibility.

In summary, compared with the prior art, the system and method for quality inspection on the entire inkjet printing manufacturing process for display devices provided in the disclosure mainly have the following technical advantages.

1. The disclosure makes a brand new design to the key constitution module structure and its operation method for quality inspection on the entire process, which can accurately realize a comprehensive and systematic on-line quality inspection on a series of operations, including substrate inspection, nozzle inspection, flying ink droplet inspection, liquid coating inspection and cured coating inspection and so on, thereby effectively compensating for the shortcoming of current technologies which only perform inspection on a single part instead of the entire process.

2. The disclosure further studies and improves the inspection algorithms and operation steps of all inspection details, thereby realizing quick and accurate inspection on corresponding defects, and establishes a defect feature database and a distribution map to facilitate subsequent defect analysis.
3. The disclosure also combines the actual working conditions and requirements of the ink printing manufacturing for display devices, and studies the feature parameters and defects in the substrate, nozzle, ink droplets, liquid coating, and cured coating in the entire quality inspection process. Moreover, the disclosure designs the parameterized defect determining criteria, and therefore can more intuitively and accurately reflect the quality problems in every stage of the inkjet printing manufacturing process correspondingly.
4. The disclosure can also integrate the coating thickness measurement based on white light interferometry into the inkjet printing manufacturing process, so as to realize the online accurate and precise measurement of parameters such as thickness, volume, uniformity and other parameters of the liquid coating and cured coating manufactured through inkjet printing.
5. The disclosure takes into comprehensive consideration of the quality inspection results of every detail in the inkjet printing manufacturing process, forms an inspection and control closed-loop in the entire inkjet printing manufacturing process, and compares every defect feature database so as to verify the measurement results of every stage and adjust the defect determining criteria. In the meantime, the disclosure analyses the source of defects, thereby correspondingly realizing improved quality inspection and modulation with higher precision, significantly improving the yield rate of the display device products. Therefore, the disclosure is particularly suitable for processing and manufacturing various new types of display devices with ultra-high resolution, large size, slimness and flexibility.

BRIEF DESCRIPTION OF THE DRAWINGS

In all the drawings, the same reference numerals are used to denote the same elements or structures.

DETAILED DESCRIPTION OF DISCLOSED EMBODIMENTS

In order to make the objectives, technical solutions and advantages of the present disclosure clearer, the following further describes the present disclosure in detail with reference to the accompanying drawings and embodiments. It should be understood that the specific embodiments described herein are only used to explain the present disclosure, but not to limit the present disclosure.

Figure 1:
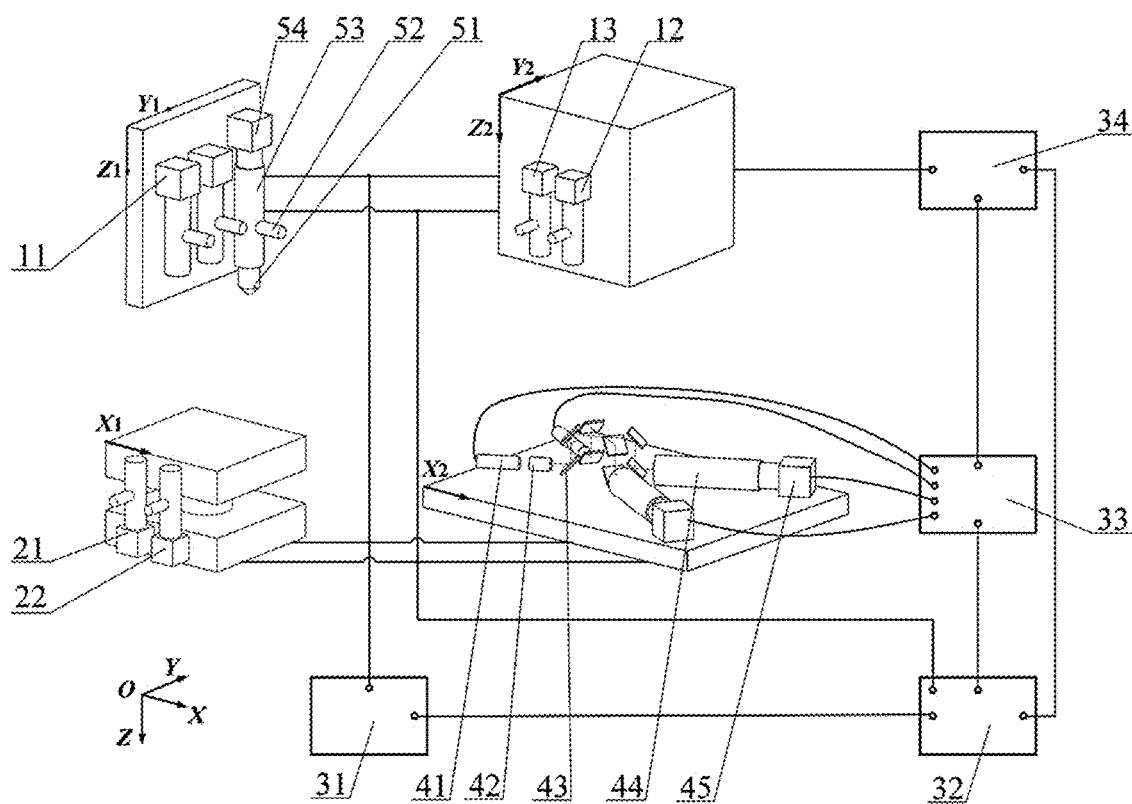
FIG. 1 is a schematic view of a framework of an overall system for quality inspection of the entire inkjet printing manufacturing process for display devices constructed by the disclosure.

FIG. 1 is a schematic view of a framework of an overall system for quality inspection of the entire inkjet printing manufacturing process for display devices constructed by the disclosure. As shown in FIG. 1, the system provided in the disclosure mainly includes a substrate inspection module, a nozzle inspection module, an ink droplet inspection module, a coating thickness inspection module, and a control module. The specific framework of these key modules and their operating methods are described in details below.

First of all, the substrate inspection module includes a large-field downward-view unit 12, a high-magnification downward-view unit 13, and a high-resolution vision unit 11, etc. Among the above units, the large-field downward-view unit 12 and the high-magnification downward-view unit 13 are both arranged on a first moving part with $Y_2$ and $Z_2$ degrees of freedom, that is, the second horizontal longitudinal degree of freedom and the second vertical degree of freedom, and are respectively configured for perform coarse positioning inspection and fine positioning inspection on the substrate before inkjet printing. The high-resolution vision unit 11 is arranged on a second moving part with $Y_1$ and $Z_1$ degrees of freedom, that is, the first horizontal longitudinal degree of freedom and the first vertical degree of freedom, and configured to perform visual quality inspection on the substrate before inkjet printing as well as the liquid coating or cured coating sprayed onto the substrate.

More specifically, as exemplarily shown in FIG. 1, the large-field downward-view unit 12 may include, for example, a camera, a lens, and a coaxial point light source. In a preferred embodiment of the disclosure, the lens may preferably adopt a 0.8× magnification MML lens according to specific requirements, which has a large field of view and is configured for performing coarse positioning inspection on the substrate. The high-magnification downward-view unit 13 may include, for example, a camera, a lens, and a coaxial point light source. In a preferred embodiment of the disclosure, the lens may adopt a 4× magnification MML lens according to specific requirements, which has high measurement accuracy, and is configured to perform fine positioning inspection on the substrate, and may be configured to perform defect inspection on partial regions of the substrate. The large-field downward-view unit 12 and the high-magnification downward-view unit 13 are both arranged on a first moving part with $Y_2$ and $Z_2$ degrees of freedom, and preferably can be arranged on a print headmodule of an inkjet printing device. The high-resolution vision unit 11 may include, for example, a high-resolution camera, a lens, and a coaxial light source. In a preferred embodiment of the disclosure, the camera may adopt a 29 million-pixel high-resolution SVS industrial camera according to requirements, which has a large field of view and thus improving inspection efficiency, is configured for performing quick quality inspection on substrates, liquid coating, and cured coating. Preferably, multiple sets of high-resolution vision systems 11 can be provided to improve inspection efficiency, and can be arranged on the moving component with $Y_1$ and $Z_1$ degrees of freedom.

The nozzle inspection module includes a large-field upward-view unit 21 and a high-magnification upward-view unit 22, wherein the large-field upward-view unit 21 and the high-magnification upward-view unit 22 are both arranged on the third moving part with $X_1$ degree of freedom, that is, the first horizontal lateral degree of freedom, and they are respectively configured to perform positioning inspection and visual quality inspection on the print head.

More specifically, as exemplarily shown in FIG. 1, the large-field upward-view unit 21 may include, for example, a camera, a lens, and a coaxial point light source. In a preferred embodiment of the disclosure, the lens may preferably adopt a 0.8× magnification MML lens according to requirements, which has a large field of view and is configured to perform a coarse positioning inspection on the print head. The high-magnification upward-view unit 22 may include, for example, a camera, a lens, and a coaxial point light source. In a preferred embodiment of the disclosure, the lens may preferably adopt a 4× magnification MML lens according to requirements, which has high measurement accuracy and is configured to perform quality inspection on the nozzle. The large-field upward-view unit 21 and the high-magnification upward-view unit 22 are both arranged on a third moving part with $X_1$ degree of freedom, and more preferably can be arranged at the substrate absorbing platform.

The ink droplet inspection module includes two sets of horizontal vision units arranged at an included angle α. The two sets of horizontal vision units work synchronously to form a binocular vision system, which is arranged on a fourth moving part with $X_2$ degree of freedom, that is, the second horizontal lateral degrees of freedom, and is configured to perform a real-time visual inspection on the volume, velocity, angle and shape of the flying ink droplets sprayed by the print head.

More specifically, as exemplarily shown in FIG. 1, the first camera 45-1, the first lens 44-1, the first reflector set 43-1, the first collimating lens 42-1, and the first light source 41-1 are arranged coaxially along the center line. The second camera 45-2, the second lens 44-2, the second reflector set 43-2, the second collimating lens 42-2, and the second light source 41-2 are arranged coaxially along the center line. In a preferred embodiment of the disclosure, the lens may preferably adopt a 14× magnification Navitar lens according to requirements, which has high measurement accuracy. The first camera 45-1, the second camera 45-2, the first light source 41-1, and the second light source 41-2 work synchronously to form a binocular vision system. Since the observation area is required to be close to the lower surface of the print head when performing ink droplet observation, in a preferred embodiment of the disclosure, the first reflector set 43-1 and the second reflector set 43-2 each may include four reflectors to form a periscope optical path, so as to avoid interference between the first lens 44-1, the second lens 44-2 and the print head module. In other embodiments, if there is no mechanical interference, the first reflector set 43-1 and the second reflector set 43-2 can be optionally removed. The first light source 41-1 and the second light source 41-2 are high-power stroboscopic light sources, preferably a pulsed laser light source or a high-power stroboscopic LED. The first collimating lens 42-1 and the second collimating lens 42-2 collimate the optical path, and adjust the optical path with a certain divergence angle to be close to parallel light to ensure imaging brightness. The ink droplet inspection module has $X_2$ degree of freedom and is configured to inspect the volume, velocity, angle, and shape of the flying ink droplets.

The coating thickness inspection module includes a set of white light interference vision unit, which is arranged in the same manner as the high-resolution vision unit 11 on the second moving part with $Y_1$ and $Z_1$ degrees of freedom, that is, the first horizontal longitudinal degree of freedom and the first vertical degree of freedom, and is configured to perform real-time visual inspection on the coating thickness, volume and uniformity of the ink sprayed onto the substrate before and after curing.

More specifically, as exemplarily shown in FIG. 1, the white light interference vision unit may include, for example, a camera 54, a lens 53, a coaxial point light source 52, and an interference object lens 51. In a preferred embodiment of the disclosure, a lens with 20× magnification and an integrated interference object lens may be adopted according to requirements, preferably a Mirau interference object lens may be adopted, which contains a reference mirror and a beam splitter. The coating thickness inspection module is configured to inspection the thickness, volume and uniformity of the ink coating before and after curing. The coating thickness inspection module has $Y_1$ and $Z_1$ degrees of freedom, and can preferably be set up with the high-resolution vision system 11 of the substrate inspection module. $Z_1$ is a degree of freedom of high-precision movement of the position feedback device with high resolution, and preferably a grating ruler with sub-micron resolution may be adopted as the position feedback device.

In addition, the control module includes a real-time processing controller 32, a movement controller 31, a synchronous trigger control card 33, and an inkjet control card 34. The movement controller 31 is connected to the substrate inspection module, the nozzle inspection module, the ink droplet inspection module and the coating thickness inspection module respectively, controlling the movement of the modules and obtaining position feedback information. The inkjet control card 34 is configured to control the on/off of the nozzle and set the driving waveform, thereby controlling the nozzle to spray and output a triggering signal to the synchronous trigger control card 33. The synchronous trigger control card 33 receives the triggering signal and delays triggering the operation of the ink droplet inspection module, thereby performing a real-time inspection on the volume, velocity, angle and shape of the flying ink droplet. The real-time processing controller 32 is connected to the substrate inspection module, the nozzle inspection module, the ink droplet inspection module and the coating thickness inspection module respectively, thereby controlling the above modules to work and obtain corresponding image data for processing, so as to obtain multiple inspection results including substrate defects, nozzle defects, liquid coating defects, and cured coating defects. In addition, the real-time processing controller 32 is also connected to the movement controller 31, the synchronous trigger control card 33 and the inkjet control card 34 respectively, forming a closed-loop control on the entire inkjet printing manufacturing process of the display device.

More specifically, the synchronous trigger control card 33 receives the triggering signal, and triggers the first light source 41-1, the second light source 41-2, and the first camera 45-1 and the second camera 45-2 of the ink droplet inspection module to work through external triggering with a certain delay. The triggering frequency is the same as the spraying frequency to realize the image collection of flying ink droplets. In a preferred embodiment of the disclosure, the synchronous trigger control card 33 is an FPGA control circuit board with a time resolution of 20 ns. The real-time processing controller 32 is preferably an industrial computer, which is connected to respective inspection modules to control them to work and obtain image data for processing. The real-time processing controller 32 is connected with the movement controller 31, the inkjet control card 34, and the synchronous trigger control card 33 to realize parameter setting and data acquisition, and form a closed-loop control of the inkjet printing process.

As another key improvement of the disclosure, a corresponding quality inspection method is also provided, thereby correspondingly realizing quick and accurate inspection on corresponding defects, and establishing a defect feature database and a distribution map to facilitate subsequent defect analysis. In addition, the disclosure also provides specific inspection algorithms and defect definitions directed to each inspection process, and parameterized expressions for defect determining criteria.

Figure 2:
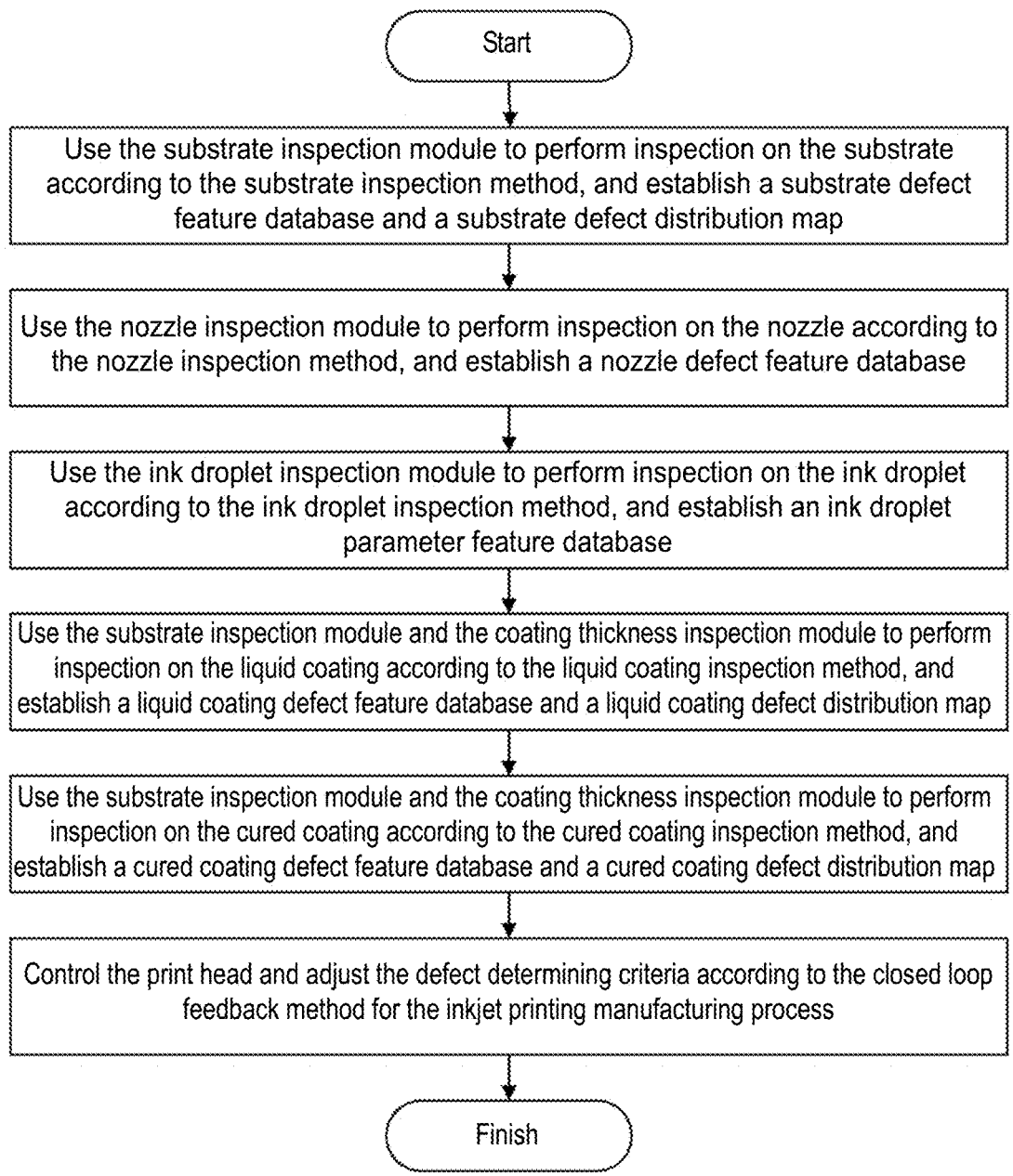
FIG. 2 is a flowchart of an overall method for quality inspection of the entire inkjet printing manufacturing process for display devices constructed by the disclosure.

Referring to FIG. 2, which shows a flowchart of an overall method for quality inspection of the entire inkjet printing manufacturing process for display devices constructed by the disclosure. As shown in FIG. 2, the method for quality inspection in the entire inkjet printing manufacturing process for display devices in the disclosure mainly includes the following steps, which will be thoroughly explained below in terms of principles and operations.

First, the substrate quality inspection step is performed.

The substrate inspection module is configured to perform positioning inspection and visual quality inspection on the substrate before inkjet printing, and record and establish the substrate defect feature database and the substrate defect distribution map.

Figure 3A:
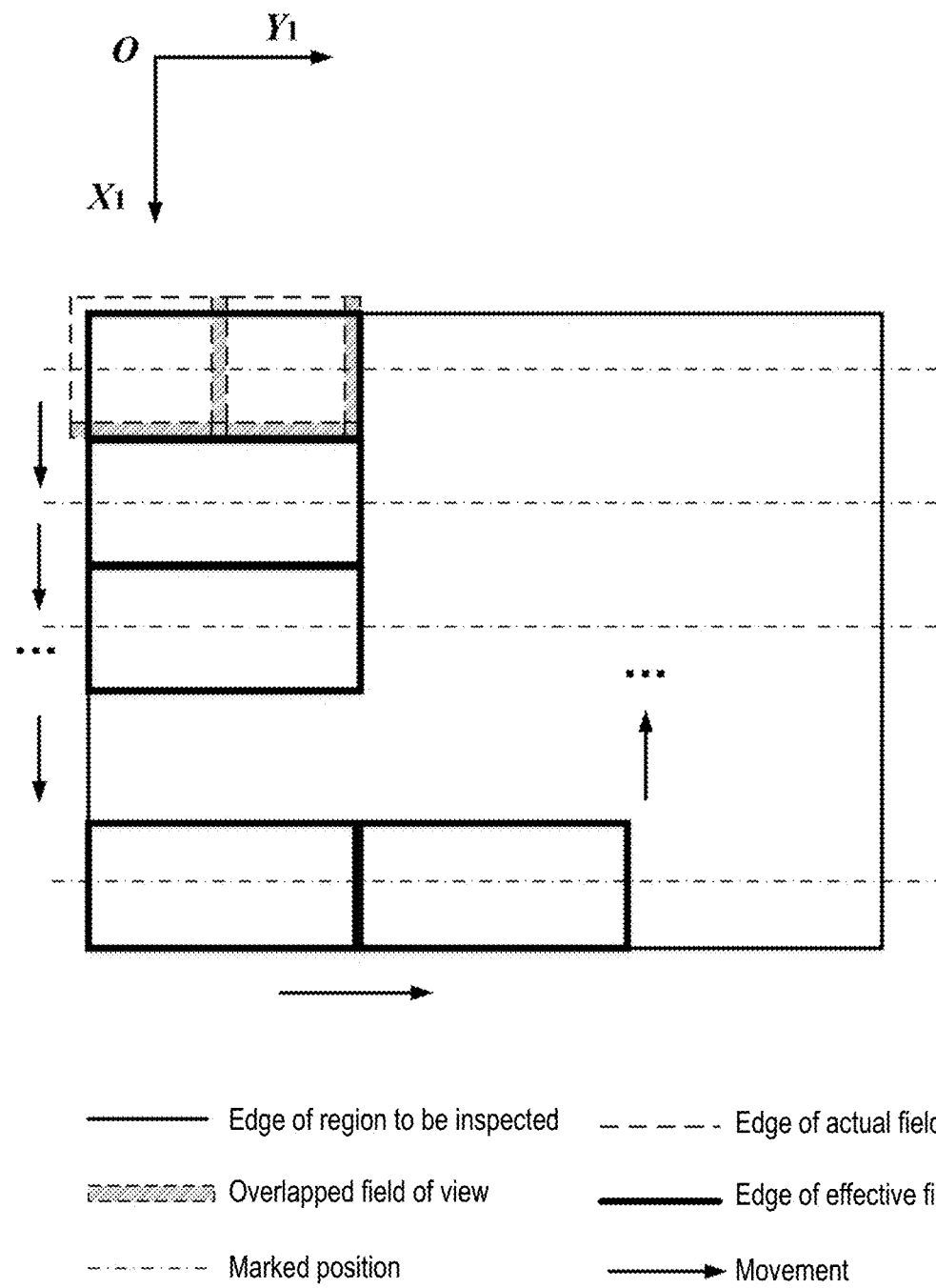
FIG. 3A is a schematic flowchart of collecting an image of a large-area substrate in a preferred embodiment of the disclosure.
Figure 3B:
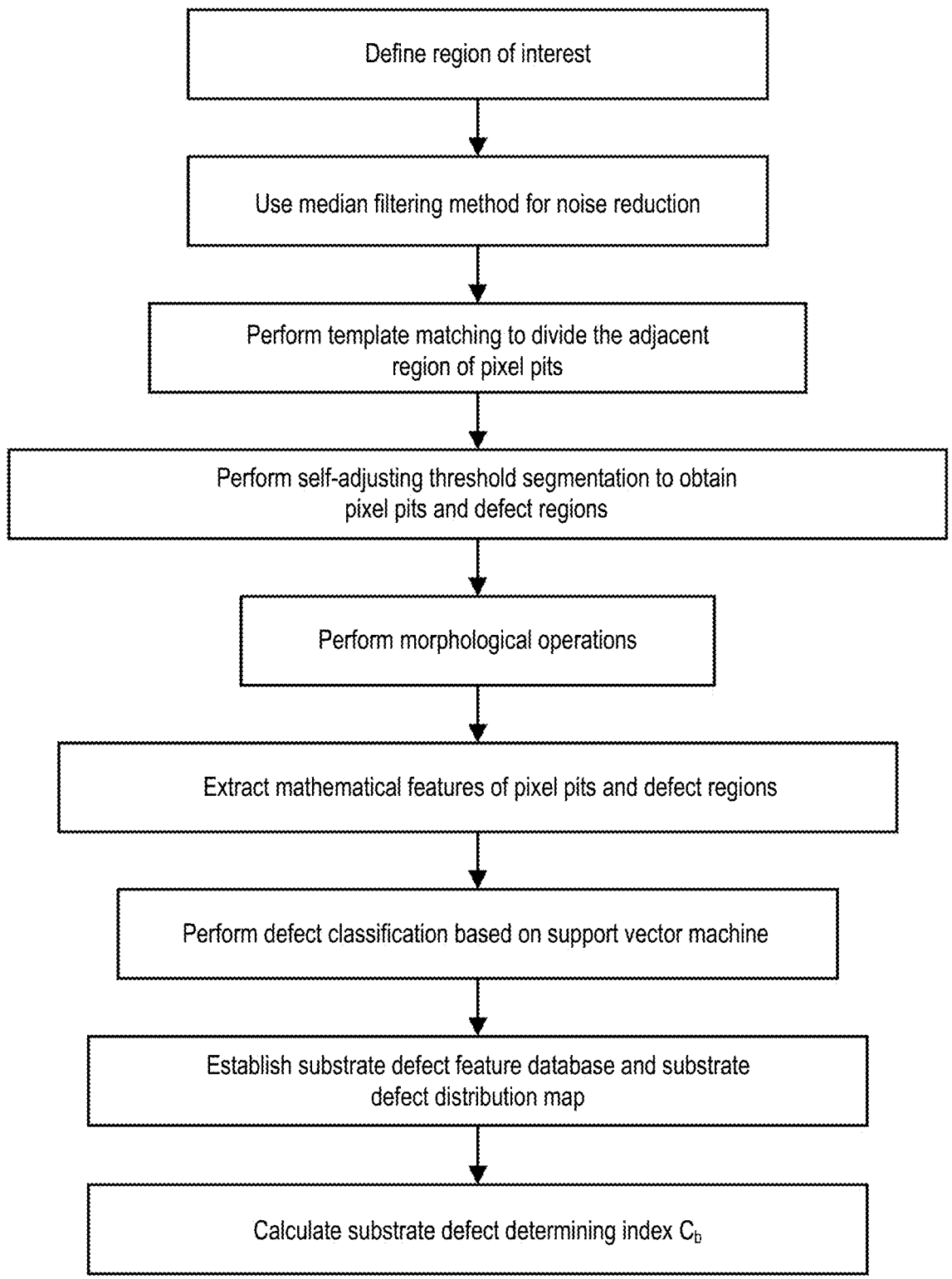
FIG. 3B is a schematic flowchart of a method for inspecting a substrate in a preferred embodiment of the disclosure.

More specifically, referring to FIG. 3A to FIG. 3B, the substrate inspection module is activated, the large-field downward-view unit 12 is adopted first to find at least 2 positioning marks on the substrate, and then the large-field downward-view unit 12 is switched to the high-magnification downward-view unit 13 for performing position inspection on the positioning marks, thereby calculating the installation position and tilt angle of the substrate.

Referring to FIG. 3A, the substrate moves sequentially to the preset marked position along the direction $X_1$, that is, the first horizontal lateral direction. In the meantime, the high-resolution vision unit 11 collects images of the substrate. After the movement in the direction $X_1$ is completed, the high-resolution vision unit 11 moves for a predetermined distance along the direction $Y_1$, that is, the first horizontal longitudinal direction, and then the substrate moves reversely in the direction $X_1$. In this way, the substrate and the high-resolution vision unit 11 move alternately until the image of the entire substrate is collected. In the process, it is ensured that there is a certain overlap area in adjacent images obtained from each collecting.

After the image of substrate is collected, the adjacent images are stitched to obtain a complete substrate image, and image processing is performed on the image to establish the substrate defect feature database and the substrate defect distribution map. Then the substrate defect determining index $C_b$ is calculated according to the following formula (1), wherein when $C_b$ is greater than the preset threshold $C_{b0}$, it is determined that the substrate is a defective substrate.

$$C_b = \sum_{i=1}^{N} b_i \left( \sum_{j=1}^{N_i} \left( \frac{D_j}{T_i} - 1 \right) \right) \qquad \text{formula (1)}$$

In the formula (1), N represents the number of defect categories of the substrate; $T_i$, $N_i$, $b_i$ respectively represent the threshold for determining the defect, the number of defects and weighting coefficient in the i-th category; $D_j$ represents the measured defect feature parameter and $D_j > T_i$; i and j respectively represent integers of 1~N and 1~$N_i$. Specifically, $C_{b0}$, $b_i$, and $T_i$ are all empirical values, which can be set artificially according to actual conditions. In addition, in some preferred embodiments, a high-magnification downward-view system 13 can be used to further accurately inspect the inspected substrate defects.

In a preferable embodiment of the disclosure, in the above operation, the operation of image processing on the substrate image may preferably further include the following processes: defining the region of interest; performing filtering and noise reduction, preferably median filtering is adopted; performing template matching to divide the neighborhood region of pixel pits, preferably a shape-based template matching method is adopted; performing self-adjusting threshold segmentation to obtain pixel pits and defect regions; performing morphological operations; extracting mathematical features of pixel pits and defect regions, preferably the features such as area, aspect ratio, and average gray are extracted; performing defect classification based on support vector machine. The principles and specific methods of these image processing operations are known in the art, so related descriptions are not be repeated here.

According to another preferred embodiment of the disclosure, the substrate defect feature database can record information such as defect serial number, type, location, size, etc., and the substrate defect distribution map shows the defect location and serial number. For specific examples, refer to the following table 1 for reference.

TABLE 1

| serial number | defect type | location | size | ... |
|---|---|---|---|---|
| 1 | Missing features | $(x_1, y_1)$ | $S_1$ | |
| 2 | Particles | $(x_2, y_2)$ | $S_2$ | |
| 3 | Scratches | $(x_3, y_3)$ | $S_3$ | |
| ... | | | | |

Next, the nozzle quality inspection step is performed.

In this step, the nozzle inspection module needs to be adopted to perform positioning inspection and visual quality inspection on the print head, and record and establish the nozzle defect feature database.

Figure 4A:
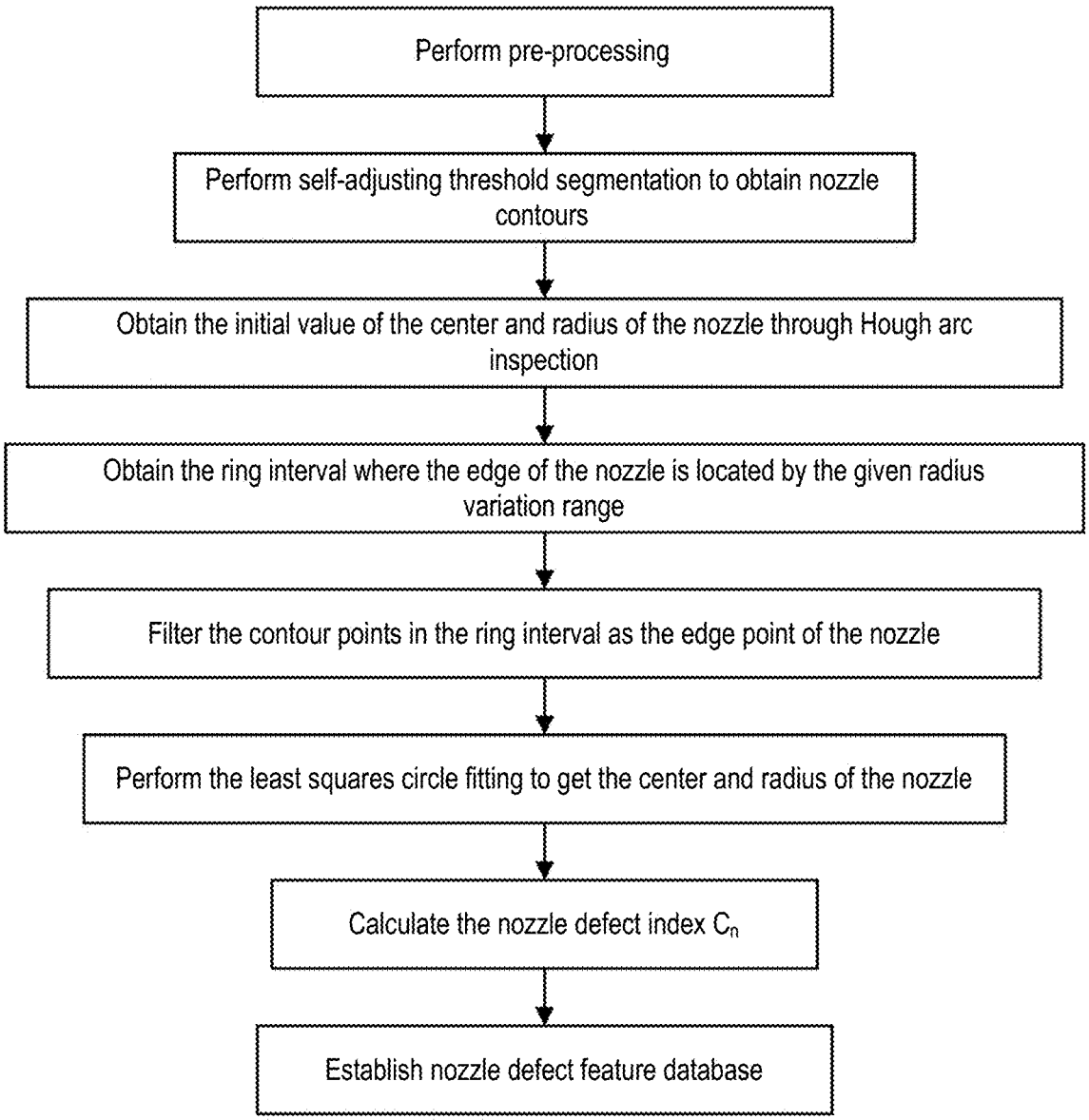
FIG. 4A is a schematic flowchart of a nozzle inspection method in a preferred embodiment of the disclosure.
Figure 4B:
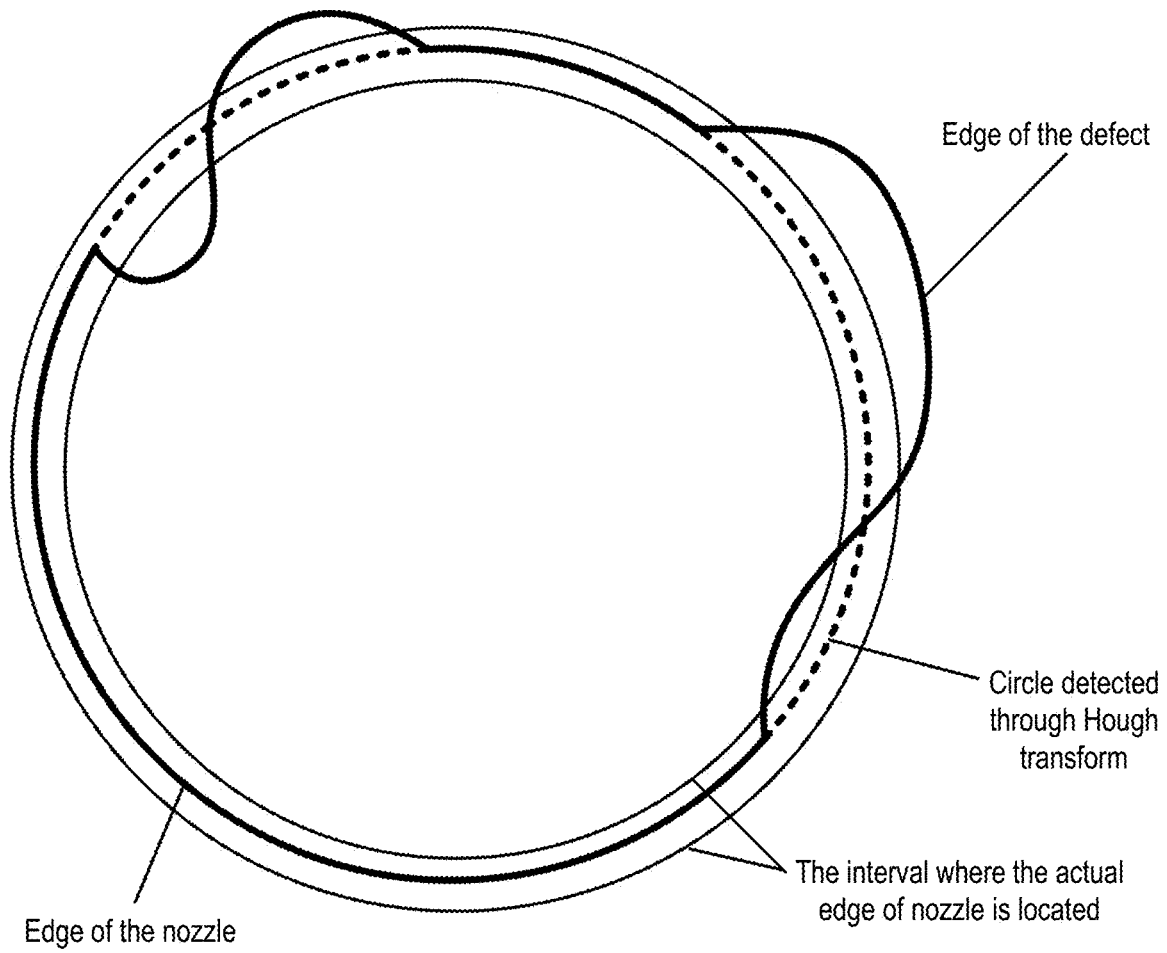
FIG. 4B is a schematic view of the inspection principle of edge circle of the nozzle in a preferred embodiment of the disclosure.

More specifically, referring to FIG. 4A to FIG. 4B, the nozzle inspection module is activated, first the large-field upward-view unit 21 is adopted to find at least 2 positioning marks of the print head. Then, the large-field upward-view unit 21 is switched to the high-magnification upward-view unit 22 for performing position inspection on the positioning marks, thereby calculating the initial position of the nozzle.

The high-magnification upward-view unit 22 collects an image of each nozzle area and obtains nozzle contour information including contour points. Then the nozzle size is measured and the nozzle defect index $C_n$ is calculated according to the following formula (2), wherein when $C_n$ is greater than the preset threshold $C_{n0}$, it is determined that the nozzle has manufacturing defect or ink residual and so on.

$$C_n = \gamma_1 \frac{1}{N} \sum_{i=1}^{N} \left| \sqrt{(x_i - x_0)^2 + (y_i - y_0)^2} - r \right| + \gamma_2 \Big( \max\left(\sqrt{(x - x_0)^2 + (y_i - y_0)^2}\right) - \min\left(\sqrt{(x - x_0)^2 + (y_i - y_0)^2}\right) \Big) \quad \text{formula (2)}$$

In formula (2), N represents the number of contour points, $x_i$ and $y_i$ respectively represent the position coordinates of the contour point numbered i, and the value of i is an integer from 1 to N; $\gamma 1$ and $\gamma 2$ are preset weighting coefficients respectively; $x_0$ and $y_0$ respectively represent the position coordinates of the center point of the nozzle; x and y respectively represent the position coordinates of any one of the multiple contour points; r represents the radius of the circle corresponding to the nozzle. In some preferable embodiments, $C_{n0}$, $\gamma 1$ and $\gamma 2$ are all empirical values, which can be set artificially according to actual conditions. Further, with the same driving waveform, the ink droplet inspection module can be adopted to inspect the half ink droplet protrusions formed by each nozzle to verify the quality of the nozzle.

According to a preferred embodiment of the disclosure, in the above step, the step of pre-processing the nozzle image may preferably include operations such as setting the region of interest and reducing noise. In addition, the operation of measuring the size of the nozzle may preferably further include the following process: obtaining a more complete arc through Hough arc inspection, obtaining the initial value of the center and radius of the nozzle→by the given radius variation range, and obtaining the ring as the interval where the real edge of the nozzle is located→regarding the contour points inside the ring as the edge of the nozzle while regarding the contour points outside the ring as the edge of the defect→performing the least squares circle fitting on the selected contour points of the nozzle to get an accurate center and radius of the nozzle. Then the nozzle defect index $C_n$ is calculated to describe the nozzle quality, and the nozzle defect feature database is established.

According to another preferred embodiment of the disclosure, the nozzle defect feature database can, for example, record information such as nozzle serial number, center, radius, nozzle defect index $C_n$, defect determining result, etc. For specific examples, refer to table 2 below.

TABLE 2

| nozzle serial number | center | radius | $C_n$ | defect | ... |
|---|---|---|---|---|---|
| 1 | $(x_1, y_1)$ | $r_1$ | $C_{n1}$ | Y or N | |
| 2 | $(x_2, y_2)$ | $r_2$ | $C_{n2}$ | Y or N | |
| 3 | $(x_3, y_3)$ | $r_3$ | $C_{n3}$ | Y or N | |
| ... | | | | | |

Next, the flying ink droplet inspection step is performed.

In the step, an ink droplet inspection module is adopted to perform real-time visual inspection on the volume, velocity, angle and shape of the flying ink droplet that is sprayed by the printhead, and record and establish an ink droplet parameter feature database.

More specifically, first the ink droplet inspection module is activated, and the two sets of horizontal vision units are synchronously triggered to collect images of flying ink droplets at multiple timings in a strobe mode, until the inspection on flying ink droplet from all nozzles is completed. Then, the stereo calibration and image processing are performed on the image of the flying ink droplets, then the shapes of the ink droplets sequentially, and a series of ink droplet parameters such as volume, velocity, and angle are simultaneously measured. Furthermore, the ink droplet defect index $C_d$ is calculated according to the following formula (3), wherein when $C_d$ is greater than the preset threshold $C_{d0}$, it is determined that the ink droplet is a defective ink droplet.

$$C_d = d_1 \left| \frac{V}{V_0} - 1 \right| + d_2 \left| \frac{v}{v_0} - 1 \right| + d_3 \left| \frac{\varphi}{\varphi_0} - 1 \right| + d_4 \left| \frac{\theta}{\theta_0} - 1 \right| \quad \text{formula (3)}$$

In formula (3), $V_0$, $v_0$, $\varphi_0$, and $\theta_0$ respectively represent the preset ink droplet volume threshold, velocity threshold, and two angle thresholds; $d_1$, $d_2$, $d_3$, and $d_4$ respectively represent the preset weighting coefficients; V represents the actually measured volume of the flying ink droplet, v represents the actually measured velocity of the flying ink droplet; $\varphi$ and $\theta$ represent the actually measured azimuth and pitch angle of the flying ink droplet.

As exemplarily shown in FIG. 5A to FIG. 5D, first, the first light source 41-1, the second light source 41-2, the first camera 45-1, and the second camera 45-2 of the ink droplet inspection module can be triggered externally through the synchronous trigger control card 33. The lag time $t_1$ relative to the spraying is set, the ink droplet image at the time 1 is collected in a strobe mode. The lag time $t_2$ relative to the spraying is set, the ink droplet image at the time 2 is collected in a strobe mode. The inspection on all nozzles is realized through the movement in $X_2$ and $Y_2$ degrees of freedom.

Figure 5A:
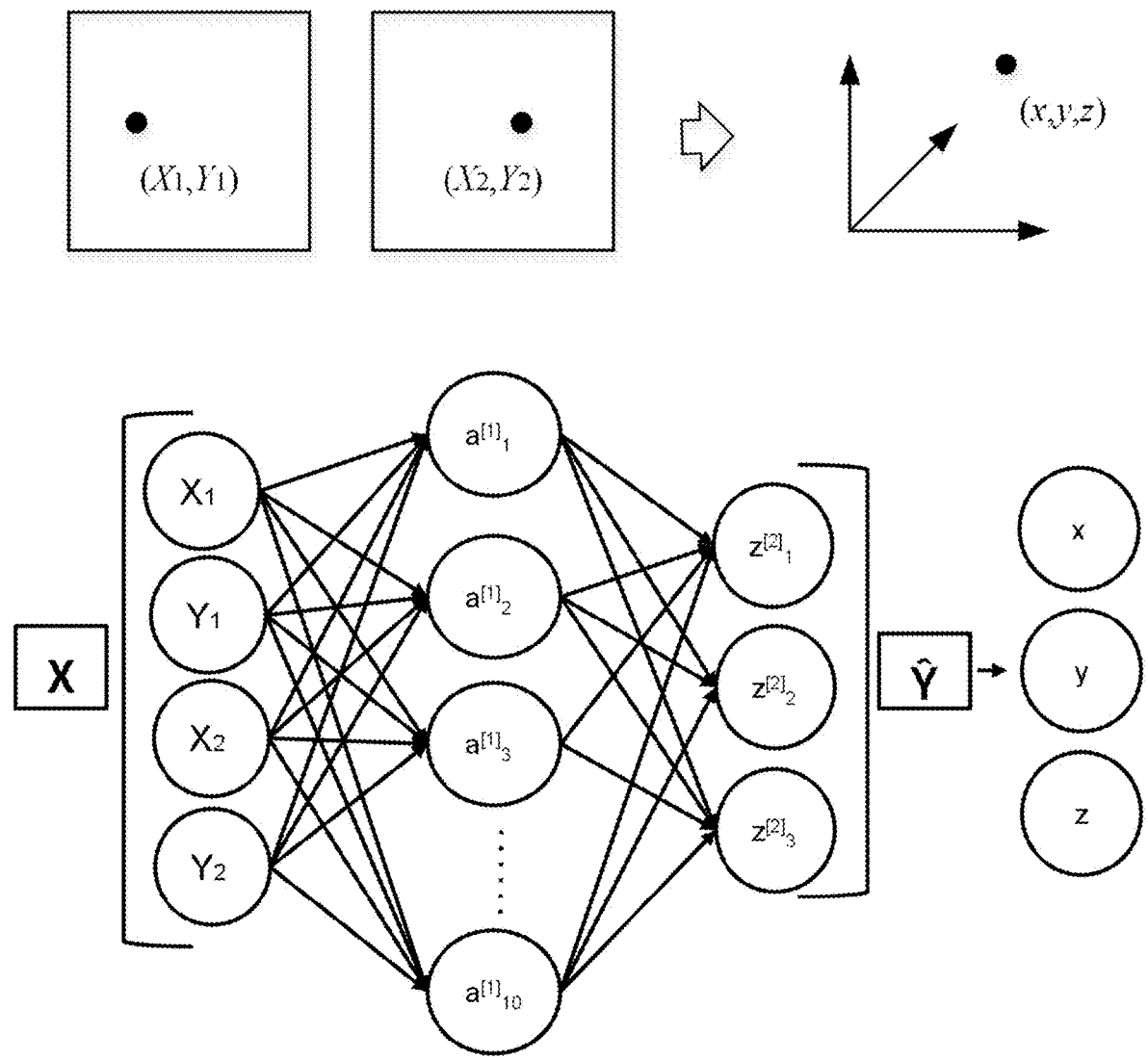
FIG. 5A is a schematic view of the stereo calibration method in ink droplet inspection in a preferred embodiment of the disclosure.

According to a preferred embodiment of the disclosure, due to the small field of view and small depth of field scenes under high magnification, the conventional calibration plate-based calibration method does not work well. It is preferable to adopt a Renishaw standard ball with a diameter of 300 um for calibrating the binocular vision system. Refer to FIG. 5A for details. A standard ball is configured on the print head module, the standard ball is controlled to move within the field of view of the ink droplet inspection module, and the position of the standard ball is recorded as (x, y, z). Stereo calibration is performed through the neural network, thereby obtaining the variation relationship between the coordinates $(X_1, Y_1)$ and $(X_2, Y_2)$ of the standard ball in the images captured by the first camera 45-1 and the second camera 45-2 and the three-dimensional coordinate (x, y, z) of the movement coordinate system. The designed neural network is preferably a two-layer neural network.

Figure 5B:
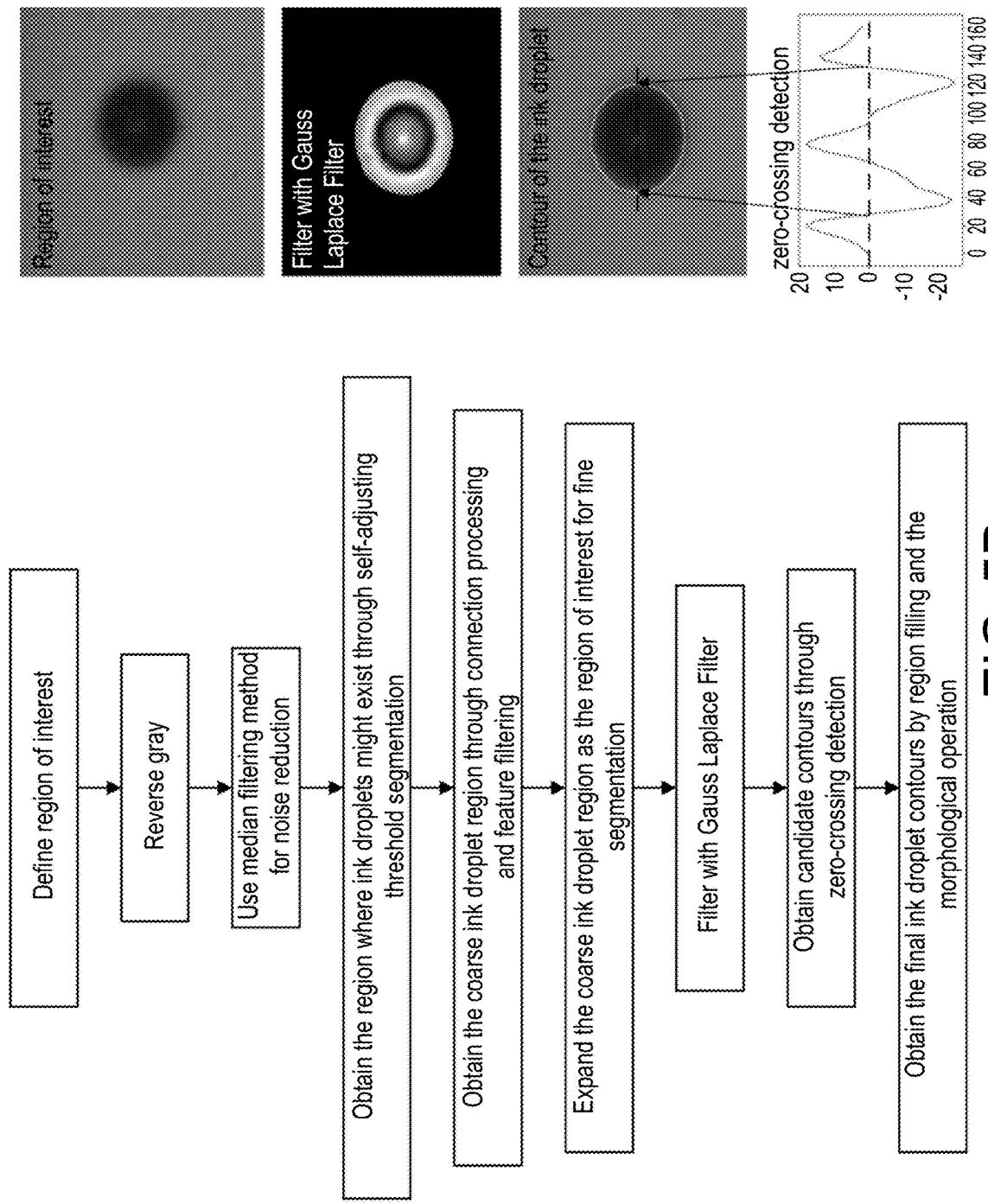
FIG. 5B is a flowchart of an ink droplet image processing method in a preferred embodiment of the disclosure.

Next, referring to FIG. 5B, according to another preferred embodiment of the disclosure, the ink droplet image processing can be performed as follows. The region of interest is defined for the ink droplet image at the time 1 and the time 2. The ink droplet region is converted from low gray region to high gray region through gray reversal. Preferably the median filtering method is adopted for noise reduction. The region where ink droplets might exist is obtained through self-adjusting threshold segmentation. The coarse ink droplet region is obtained through connection and feature threshold method, and is selected preferably according to the region area and roundness feature. The coarse ink droplet region is expanded as the region of interest for fine segmentation, and preferably the expanded region is obtained through morphological expansion. Gauss Laplace Filter is adopted to solve the divergence of the gradient of the region of interest. Candidate contours of ink droplets are obtained through zero-crossing detection. The region filling and the morphological operation are performed to obtain the final ink droplet contours.

Figure 5C:
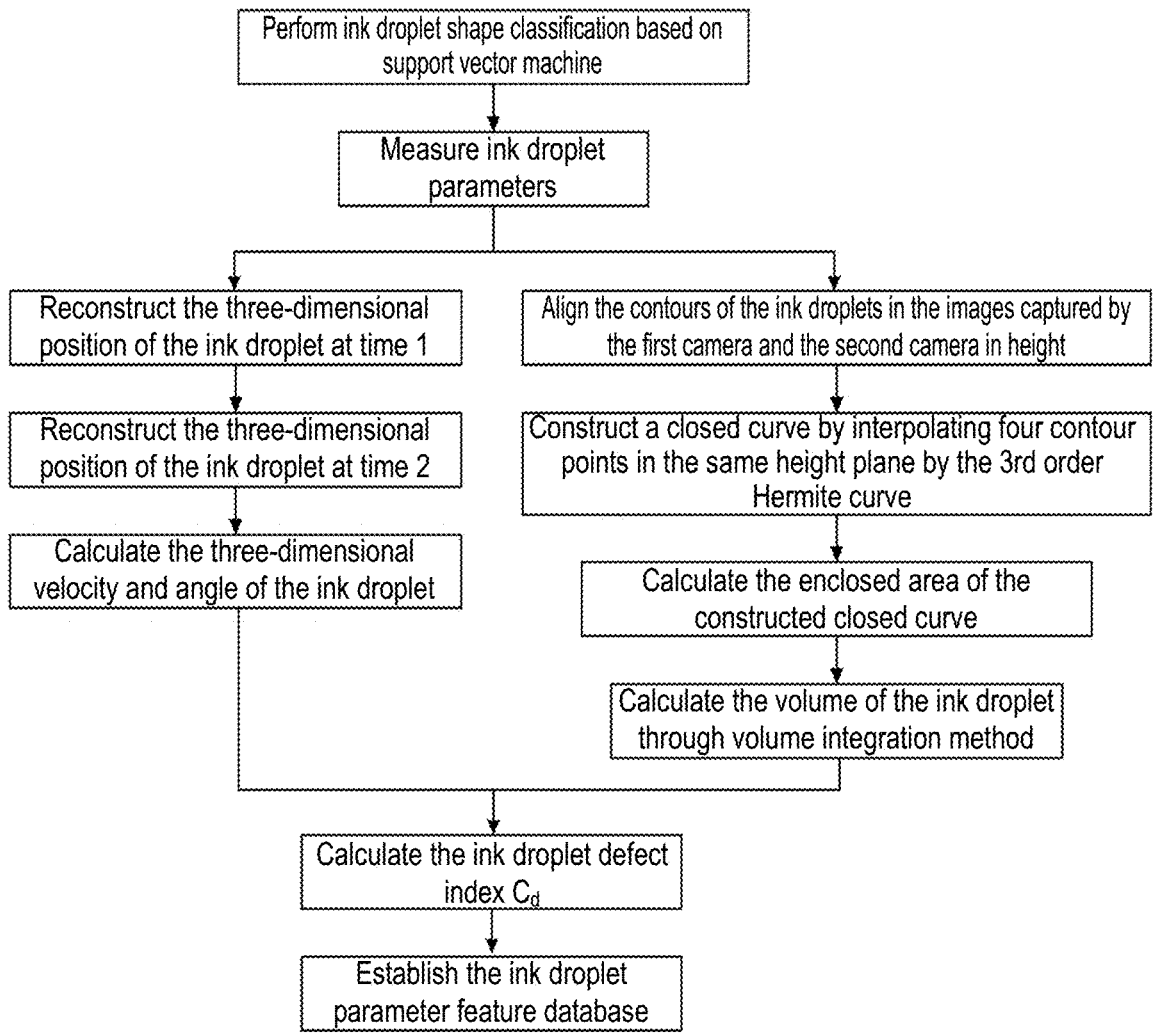
FIG. 5C is a flowchart of an inspection method for ink droplet shape and three-dimensional parameters in a preferred embodiment of the disclosure.
Figure 5C:
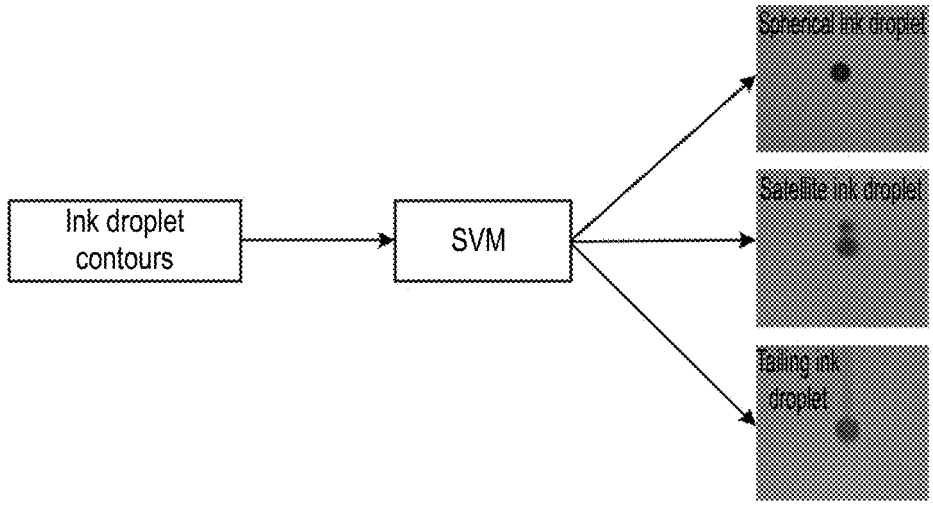

Then referring to FIG. 5C, according to another preferred embodiment of the disclosure, the volume, velocity, angle, and shape of the ink droplet can be inspection in the following methods. For example, the shape of the ink droplet can be classified by a support vector machine to identify spherical ink droplet, satellite ink droplet, tailing, etc. Then the ink droplet parameters are measured, and the three-dimensional position of the ink droplet at time 1 and time 2 is reconstructed respectively according to the results of the stereo calibration, so as to calculate the three-dimensional velocity and angle of the ink droplet. The contours of the ink droplets in the images captured by the first camera 45-1 and the second camera 45-2 are aligned in terms of height. The 3rd order Hermite curve interpolation is adopted to construct the closed curve according to the four contour points in the same height plane. The enclosed area of the constructed closed curve is calculated, and the volume of the ink droplet is calculated through volume integration method. The volume threshold $V_0$, velocity threshold $v_0$, angle threshold $\varphi$ and $\theta_0$, and weighting coefficients $d_1$, $d_2$, $d_3$, and $d_4$ are set artificially according to actual conditions. The ink droplet defect index $C_d$ is calculated to screen out defective ink droplets, thereby establish the ink droplet parameter feature database.

Figure 5D:
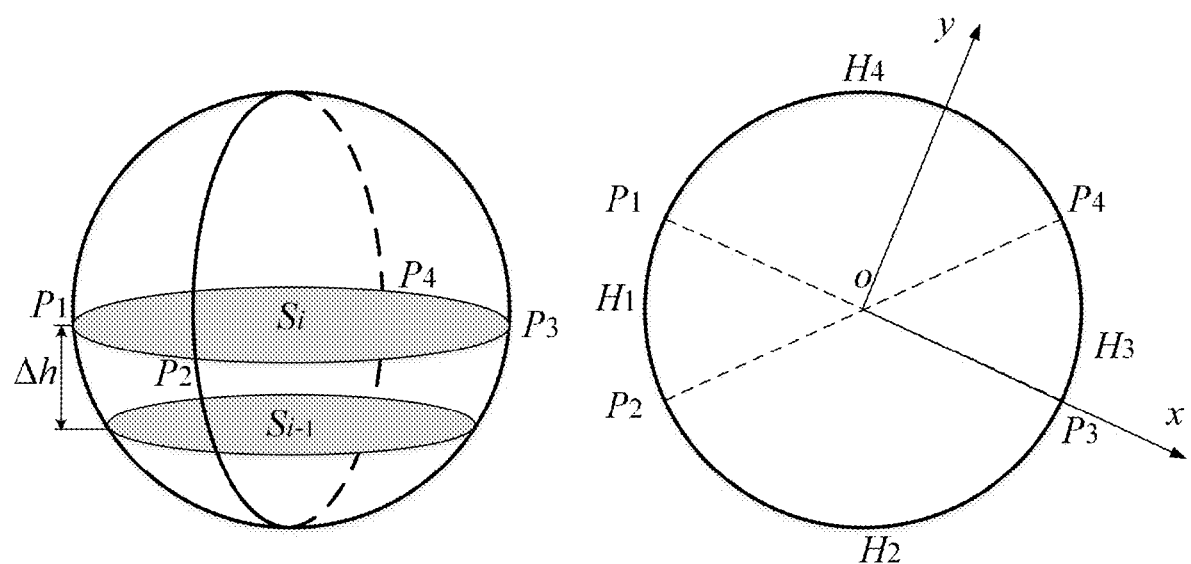
FIG. 5D is a schematic view of the principle of three-dimensional reconstruction of ink droplet volume in a preferred embodiment of the disclosure.

Then referring to FIG. 5D, according to another preferred embodiment of the disclosure, the actual volume V of the flying ink droplet can be measured preferably by the following process.

For the images of flying ink droplets respectively obtained by the two sets of horizontal vision units, align the two contours in height, and the 3rd order Hermite curve interpolation is adopted to construct the closed curve represented by the following formula (4) according to the four contour points in the same height plane. Then the enclosed area S of the constructed closed curve is calculated, and the actual volume V of the flying ink droplet is calculated according to the following formulas (5) and (6) through the volume integration method.

$$H(x) = \quad \text{formula (4)}$$
$$y_1\left(1 + 2\frac{x-x_1}{x_2-x_1}\right)\left(\frac{x-x_2}{x_1-x_2}\right)^2 + y_2\left(1 + 2\frac{x-x_2}{x_1-x_2}\right)\left(\frac{x-x_1}{x_2-x_1}\right)^2 +$$
$$y_1'(x-x_1)\left(\frac{x-x_2}{x_1-x_2}\right)^2 + y_2'(x-x_2)\left(\frac{x-x_1}{x_2-x_1}\right)^2$$

$$S = -k_1 \int_{x_1}^{x_2} H_1(x)dx - \quad \text{formula (5)}$$
$$k_2 \int_{x_2}^{x_3} H_2(x)dx + k_3 \int_{x_3}^{x_4} H_3(x)dx + k_4 \int_{x_4}^{x_1} H_4(x)dx$$

$$V = \Delta h \sum S_i \quad \text{formula (6)}$$

In the formulas, H(x) represents the structure curve between two contour points, and four segments of curves $H_1$, $H_2$, $H_3$, and $H_4$ are constructed between the four contour points in the same height plane; $(x_1, y_1)$ and $(x_2, y_2)$ respectively represent the coordinate values of the two adjacent contour points that construct the Hermite curve; $y_1'$ and $y_2'$ respectively represent the derivatives at the point $(x_1, y_1)$ and $(x_2, y_2)$; $k_1$, $k_2$, $k_3$, $k_4$ respectively represent the correction coefficient for correcting the error of the ink droplet contour approximately represented by the Hermite curve; $\Delta h$ represents the height between the adjacent height planes; $S_i$ represents the area enclosed by the closed curve in the i-th height plane.

In addition, according to another preferred embodiment of the disclosure, the ink droplet parameter feature database can record the nozzle serial number corresponding to the ink droplets, the ink droplet shape classification result, the volume, the velocity, the azimuth angle, the pitch angle, the ink droplet defect index $C_d$, the ink droplet defect determining results and so on. Please refer to table 3 below for specific examples.

TABLE 3

| nozzle serial number | shape | volume | velocity | azimuth angle | pitch angle | $C_d$ | defect | ... |
|---|---|---|---|---|---|---|---|---|
| 1 | spherical | $V_1$ | $v_1$ | $\varphi_1$ | $\theta_1$ | $C_{d1}$ | Y or N | |
| 2 | satellite | $V_2$ | $v_2$ | $\varphi_2$ | $\theta_2$ | $C_{d2}$ | Y or N | |
| 3 | tailing | $V_3$ | $v_3$ | $\varphi_3$ | $\theta_3$ | $C_{d3}$ | Y or N | |
| ... | | | | | | | | |

Next, the liquid coating inspection step is performed.

In the step, the substrate inspection module and the coating thickness inspection module are adopted to perform visual inspection on the quality of the liquid coating and the thickness of the liquid coating sprayed onto the substrate, and record and establish a liquid coating defect feature database and a liquid coating defect distribution map.

Figure 6A:
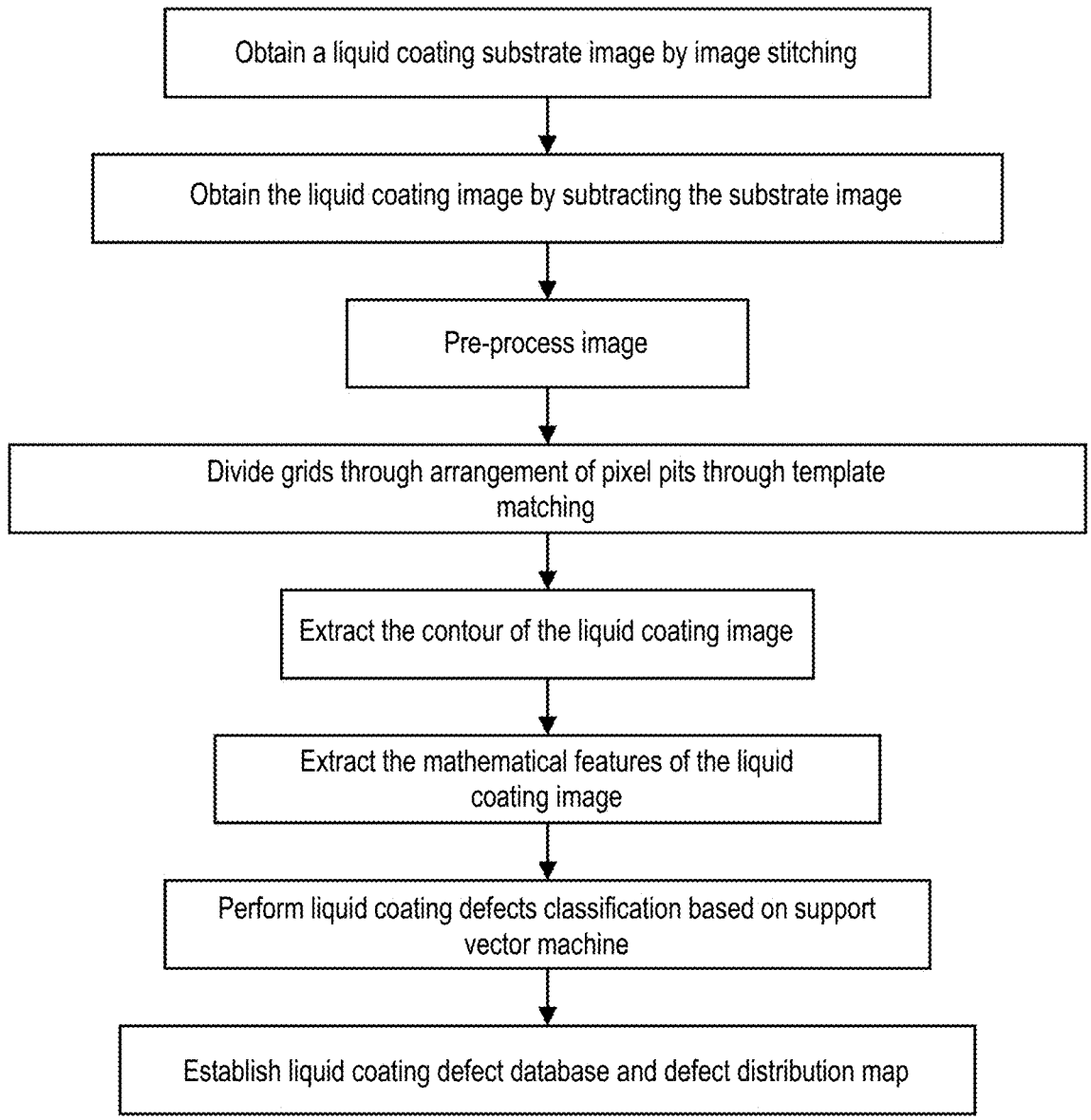
FIG. 6A is a schematic flowchart of a liquid coating inspection method in a preferred embodiment of the disclosure.
Figure 6B:
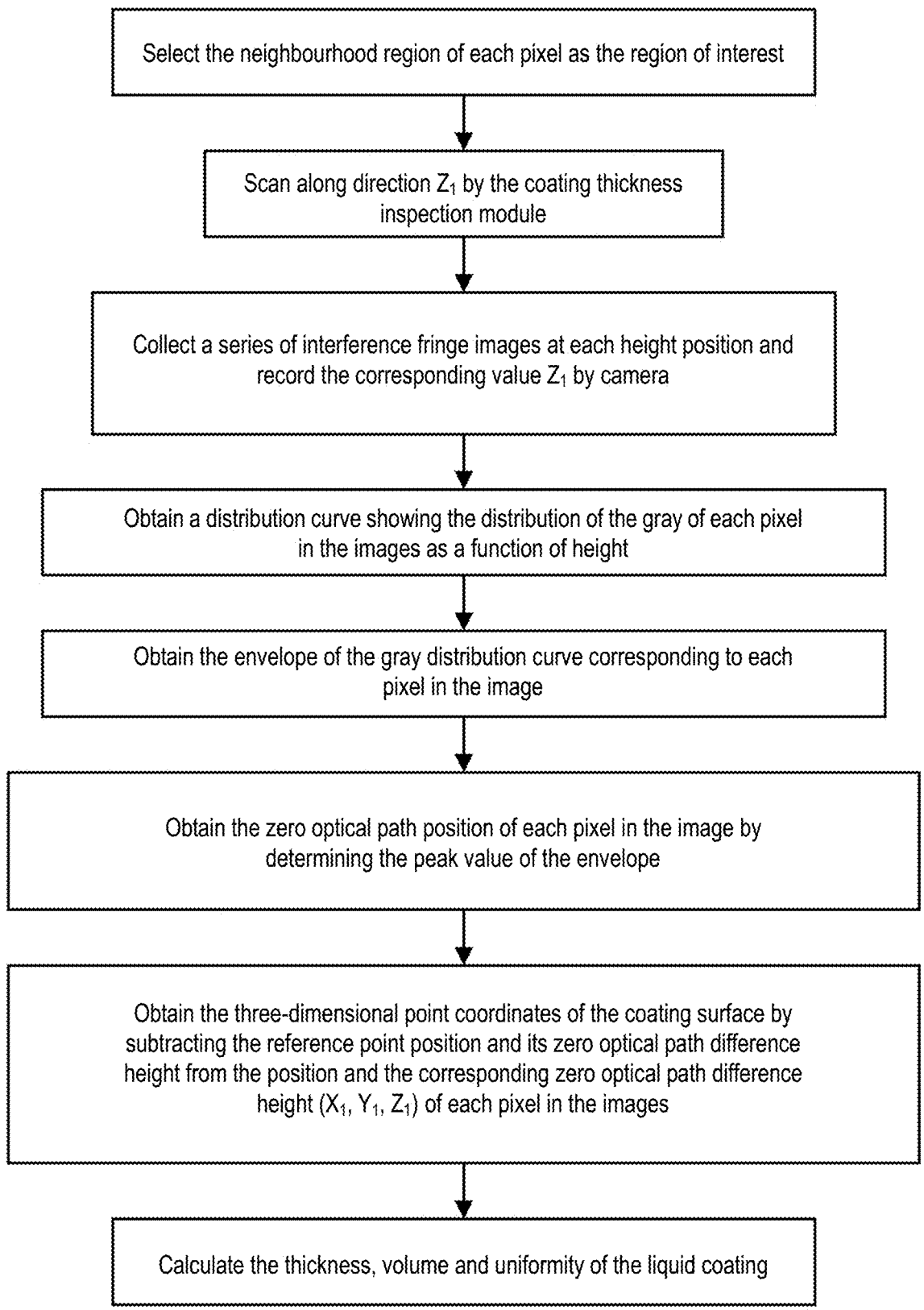
FIG. 6B is a schematic flowchart of a coating thickness inspection method based on white light interference in a preferred embodiment of the disclosure.

More specifically, as shown in FIG. 6A to FIG. 6B, in the liquid coating inspection step, first the substrate after inkjet printing is sequentially moved to the preset marked position according to the position feedback along the direction $X_1$, that is, the first horizontal lateral direction. In the meantime, the high-resolution vision unit 11 collects the image of the current substrate. After the movement in the direction $X_1$ is completed, the high-resolution vision unit 11 moves for a preset distance along the direction $Y_1$, that is, the first horizontal longitudinal direction, and then the substrate moves reversely in the direction $X_1$. In this manner, the high-resolution vision unit 11 and the substrate move alternately until the image of the liquid coating is completely collected. In this process, it should be ensured that there is a certain overlap area in the adjacent images obtained from each image collection.

After the image collection of the liquid coating is completed, adjacent images are stitched to obtain a complete liquid coating substrate image, background subtraction and image processing are performed on the obtained image, and a liquid coating defect feature database and a liquid coating defect distribution map are established. In the operation process, according to a preferred embodiment of the disclosure, the step of processing the image may include operations such as setting the region of interest and noise reduction; performing template matching to divide grids through arrangement of pixel pits, preferably a shape-based template matching method is adopted; extracting the contour of the liquid coating image in the grid region corresponding to each pixel pit; further extracting mathematical features of the liquid coating image, and the mathematical features preferably include position, area, aspect ratio, average gray and so on; adopting the support vector machine to identify defects such as insufficient filling in the pit, ink overflow, insufficient volume in the pit, volume interference in the pit, bridging between pits, and scattered points. The principles and specific methods of these image processing operations are known in the art, so related descriptions are not be repeated here.

The coating thickness inspection module is activated to perform scanning along the direction $Z_1$, that is, the first vertical direction, so as collect a series of interference fringe images at each height position and record the corresponding vertical position value. The liquid coating thickness distribution and liquid coating volume are calculated according to the white light interference principle. During this operation, according to another preferred embodiment of the disclosure, as shown exemplarily in FIG. 6B, for example, the neighborhood region of each pixel can be the region of interest, and the liquid coating in the region of interest can be inspected according to the white light interference principle. The coating thickness inspection module performs scanning along direction $Z_1$, the camera 54 collects a series of interference fringe images at each height position and records the corresponding value $Z_1$, the interference fringe images of all frames are processed, thereby obtaining a distribution curve showing the distribution of the gray of each pixel in the images as a function of height. The envelope of the gray distribution curve corresponding to each pixel in the images is obtained, and the envelope can be obtained preferably through the method based on Hilbert transformation. Then, the peak value of the envelope of the gray distribution curve corresponding to each pixel in the images is determined. The height value $Z_1$ corresponding to the peak value is the zero optical path difference position.

Since the white light interferometry measures the zero optical path difference position instead of the absolute height, the reference point position and its zero optical path difference position are subtracted from the position and the corresponding zero optical path difference height $(X_1, Y_1, Z_1)$ of each pixel in the images to obtain the three-dimensional point coordinates of the coating surface, and then the liquid coating thickness is further calculated; preferably the volume integration method is adopted to calculate the liquid coating volume.

Additionally, the local uniformity index $U_{local}$ of the liquid coating and the global uniformity index $U_{global}$ of the liquid coating are calculated according to the following formulas (7) and (8), and the inkjet printing quality is assessed based on these two indexes.

$$U_{local} = \frac{S_h}{S_{local}} \qquad \text{formula (7)}$$

$$U_{global} = \frac{1}{K}\sum_{k=1}^{K} U_k, \ U_k = \begin{cases} 0, & \frac{|h_{c,k} - \overline{h}|}{\overline{h}} > \lambda_2 \\ U_k, & \frac{|h_{c,k} - \overline{h}|}{\overline{h}} \leq \lambda_2 \end{cases} \qquad \text{formula (8)}$$

In the above formulas, $S_{local}$ represents the area of the defined region of interest of the liquid coating substrate inspection image; $S_h$ represents the area of the region of which the thickness h satisfies $$\frac{|h - h_c|}{h_c} \leq \lambda_1$$

and which begins to be searched from the center of the region of interest, wherein $h_c$ represents the center thickness of the region of interest. $\lambda_1$ represents the preset local uniformity coefficient of the liquid coating, $\lambda_2$ represents the preset global uniformity coefficient of the liquid coating; K represents the number of regions of interest determined by sampling when calculating the global uniformity; $h_{c,k}$ and $U_k$ respectively represent the central thickness and local uniformity of the k-th region of interest, wherein the value of k is an integer from 1 to K; $\overline{h}$ represents the average value of the center thickness of the liquid coating of the K regions of interest.

In addition, according to another preferred embodiment of the disclosure, the liquid coating defect feature database can record information such as defect serial number, defect type, coordinates of the pixel pit to which the defect belongs, defect location, size, etc. Furthermore, with regard to the insufficient volume in pits and volume interference defects, the volume thereof can be recorded, and the liquid coating defect distribution map shows the defect location and serial number. For specific examples, see table 4 below.

TABLE 4

| defect serial number | defect type | coordinates of pixel pit | location | size | volume . . . |
|---|---|---|---|---|---|
| 1 | Insufficient filling in pits | $(R_1, C_1)$ | $(x_1, y_1)$ | $S_1$ | |
| 2 | Ink overflow | $(R_2, C_2)$ | $(x_2, y_2)$ | $S_2$ | |
| 3 | Insufficient volume in pits | $(R_3, C_3)$ | $(x_3, y_3)$ | $S_3$ | $V_3$ |
| 4 | Volume interference in pits | $(R_4, C_4)$ | $(x_4, y_4)$ | $S_4$ | $V_4$ |
| 5 | Bridge between pits | $(R_5, C_5)$ | $(x_5, y_5)$ | $S_5$ | |
| 6 | Scattered points | $(R_6, C_6)$ | $(x_6, y_6)$ | $S_6$ | |
| . . . | | | | | |

Next, the cured coating inspection step is performed.

In the step, the substrate inspection module and the coating thickness inspection module need to be adopted again to perform visual inspection on the quality of the cured coating and the thickness of the cured coating that are sprayed onto the substrate and completely cured, and record and establish a cured coating defect feature database and a cured coating defect distribution map.

Figure 7:
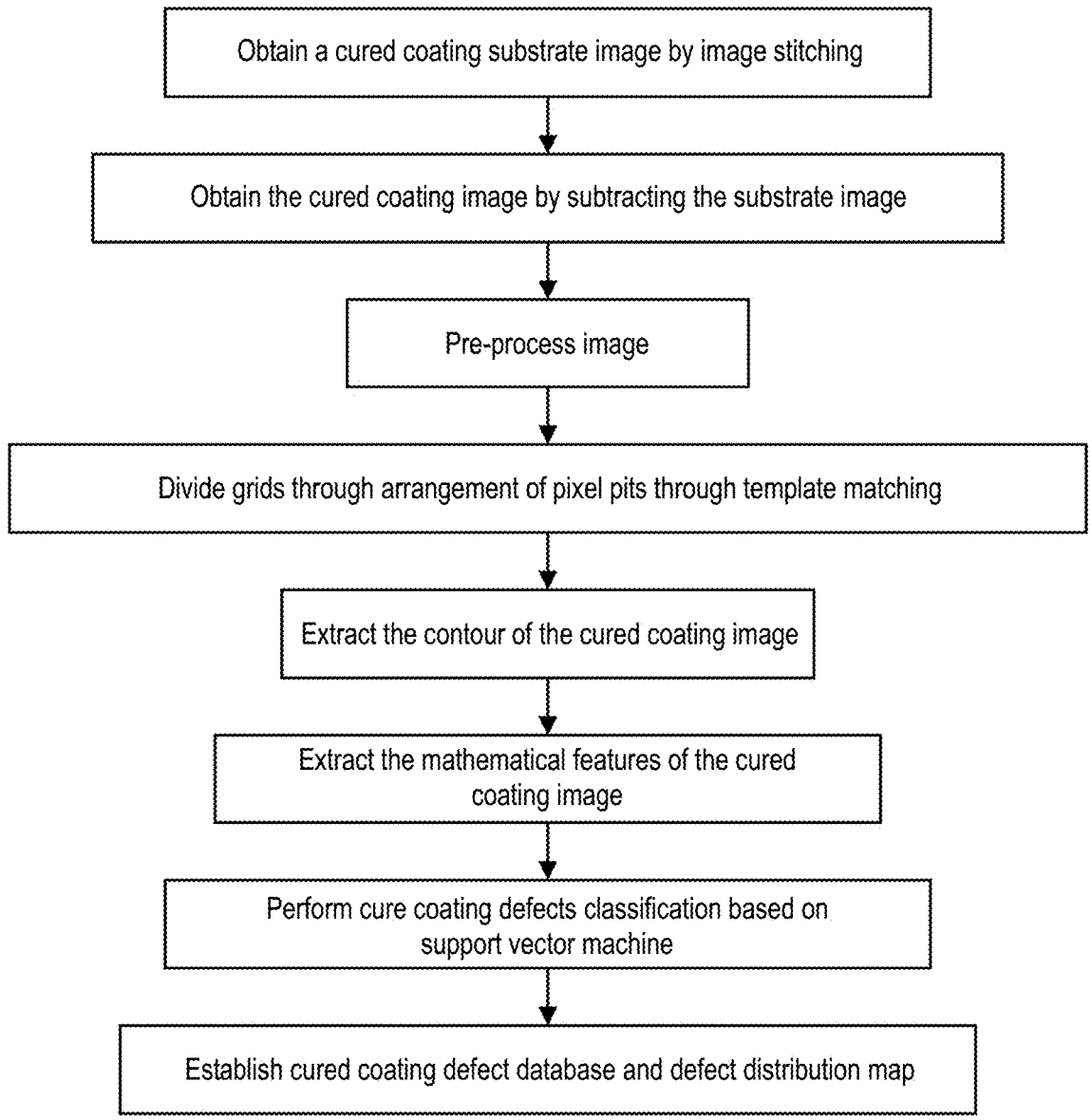
FIG. 7 is a schematic flowchart of a cured coating inspection method in a preferred embodiment of the disclosure.

More specifically, as shown in FIG. 7, the substrate after inkjet printing and curing is sequentially moved to the preset marked position according to the position feedback along the direction $X_1$, that is, the first horizontal lateral direction. In the meantime, the high-resolution vision unit 11 collects the image of the current substrate. After the movement in the direction $X_1$ is completed, the high-resolution vision unit 11 moves for a preset distance along the direction $Y_1$, that is, the first horizontal longitudinal direction, and then the substrate moves reversely in the direction $X_1$. In this manner, the high-resolution vision unit 11 and the substrate move alternately until the image of the cured coating is completely collected. In this process, it should be ensured that there is a certain overlap area in the adjacent images obtained from each image collection.

After the image collection of the cured coating is completed, the adjacent images are stitched to obtain a complete cured coating substrate image, background subtraction is performed on the obtained image, and a cured coating defect feature database and a cured coating defect distribution map are established. In the operation process, according to a preferred embodiment of the disclosure, the step of processing the image may include operations such as setting the region of interest and noise reduction; performing template matching to divide grids through arrangement of pixel pits, preferably a shape-based template matching method is adopted; extracting the contour of the cured coating image in the grid region corresponding to each pixel pit; further extracting mathematical features of the cured coating image, and the mathematical features preferably include position, area, aspect ratio, average gray and so on; adopting the support vector machine to identify defects such as insufficient filling in the pit, ink overflow, insufficient volume in the pit, volume interference in the pit, bridging between pits, and scattered points. The principles and specific methods of these image processing operations are known in the art, so related descriptions are not be repeated here.

Thereafter, the coating thickness inspection module is activated to perform scanning along the direction $Z_1$, that is, the first vertical direction, so as collect a series of interference fringe images at each height position and record the corresponding vertical position value. The cured coating thickness and cured coating volume are calculated according to the white light interference principle. During this operation, according to another preferred embodiment of the disclosure, for example, the neighborhood region of each pixel pit can be the region of interest, and the cured coating in the region of interest can be inspected according to the white light interference principle. The coating thickness inspection module performs scanning along direction $Z_1$, the camera 54 collects a series of interference fringe images at each height position and records the corresponding value $Z_1$, the interference fringe images of all frames are processed, thereby obtaining a distribution curve showing the distribution of the gray of each pixel in the images as a function of height. The envelope of the gray distribution curve corresponding to each pixel in the images is obtained, and the envelope can be obtained preferably through the method based on Hilbert transformation. Then, the peak value of the envelope of the gray distribution curve corresponding to each pixel in the images is determined. The height value $Z_1$ corresponding to the peak value is the zero optical path difference position. Since the white light interferometry measures the zero optical path difference position instead of the absolute height, the reference point position and its zero optical path difference height are subtracted from the position and the corresponding zero optical path difference height $(X_1, Y_1, Z_1)$ of each pixel in the images to obtain the three-dimensional point coordinates of the coating surface, and then the cured coating thickness is calculated; preferably the volume integration method is adopted to calculate the cured coating volume.

Next, the local uniformity index $U_{local}$ of the cured coating and the global uniformity index $U_{global}$ of the cured coating are calculated according to the following formulas (9) and (10), and the inkjet printing quality is assessed based on these two indexes.

$$U_{local} = \frac{S_h}{S_{local}} \qquad \text{formula (9)}$$

$$U_{global} = \frac{1}{K}\sum_{k=1}^{K} U_k, \quad U_k = \begin{cases} 0, & \frac{|h_{c,k} - \overline{h}|}{\overline{h}} > \mu_2 \\ U_k, & \frac{|h_{c,k} - \overline{h}|}{\overline{h}} \leq \mu_2 \end{cases} \qquad \text{formula (10)}$$

In the above formulas, $S_{local}$ represents the area of the defined region of interest of the cured coating substrate inspection image; $S_h$ represents the area of the region of which the thickness h satisfies $$\frac{|h - h_c|}{h_c} \leq \mu_1$$

and which begins to be searched from the center of the region of interest, wherein $h_c$ represents the center thickness of the region of interest. $\mu_1$ represents the preset local uniformity coefficient of the cured coating, $\mu_2$ represents the preset global uniformity coefficient of the cured coating; K represents the number of regions of interest determined by sampling when calculating the global uniformity; $h_{c,k}$ and $U_k$ respectively represent the central thickness and local uniformity of the k-th region of interest, wherein the value of k is an integer from 1 to K; $\bar{h}$ represents the average value of the center thickness of the cured coating of the K regions of interest.

In addition, according to another preferred embodiment of the disclosure, the cured coating defect feature database can record information such as defect serial number, defect type, coordinates of the pixel pit to which the defect belongs, defect location, size, etc. Furthermore, with regard to the insufficient volume in pits and volume interference defects, the volume thereof can be recorded, and the cured coating defect distribution map shows the defect location and serial number. The cured coating defect feature database and its distribution map are the same as the liquid coating defect feature database and its distribution database. For specific examples, see table 4 above.

Finally, quality inspection and closed-loop feedback control steps are performed.

In the step, the defect determining criteria for the substrate, the nozzle, the ink droplets, the liquid coating, and the cured coating are set in advance, and an inspection closed-loop between the nozzle and the ink droplet as well as an inspection closed-loop between the substrate, the nozzle, the ink droplet, the liquid coating and the cured coating are formed according to the multiple defect feature databases and parameter feature databases respectively established in the above steps. Then, the specific source of defect can be deduced and determined based on the cured coating defect and the corresponding optimal modulation can be performed. In this way, the quality closed-loop feedback control of the entire inkjet printing manufacturing process is realized.

Figure 8:
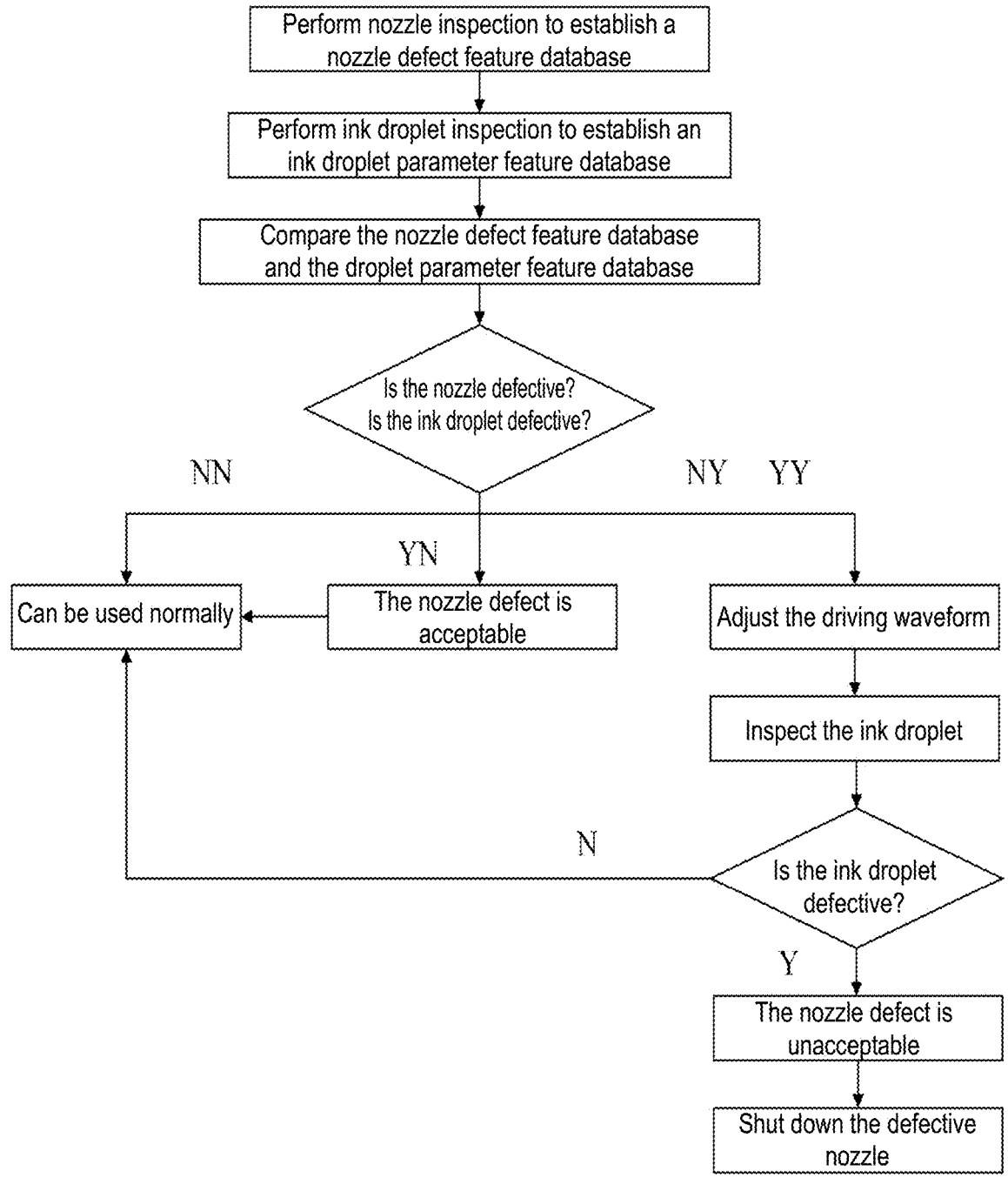
FIG. 8 is a schematic view of a closed-loop for inspection on nozzle and ink droplet in a preferred embodiment of the disclosure.

More specifically, as exemplarily shown in FIG. 8, according to a preferred embodiment of the disclosure, the step of forming the inspection closed-loop between the nozzle and the ink droplet preferably includes the following operation steps.

The nozzle defect feature database and the ink droplet parameter feature database are compared, the impact of the nozzle defect on the ink droplet defect is determined, and the nozzle that cannot be used normally due to the nozzle defect is shut down. Specifically, the criteria for determining the impact of the nozzle defect on the ink droplet defect are set as follows. If a nozzle and its sprayed ink droplets are not defective, it is determined that the nozzle can be used normally; if a nozzle is defective but its sprayed ink droplets are not defective, it is determined that the nozzle defect does not cause ink droplet defects, and the nozzle can be used normally; if the ink droplets sprayed by a nozzle are defective, the driving waveform is modulated and the ink droplet inspection is performed again. Under the circumstances, if the droplets are not defective, it is determined that the nozzle itself does not cause ink droplet defects and can be used normally, otherwise it is determined the nozzle defect is unacceptable and the defective nozzle is shut down.

Figure 9:
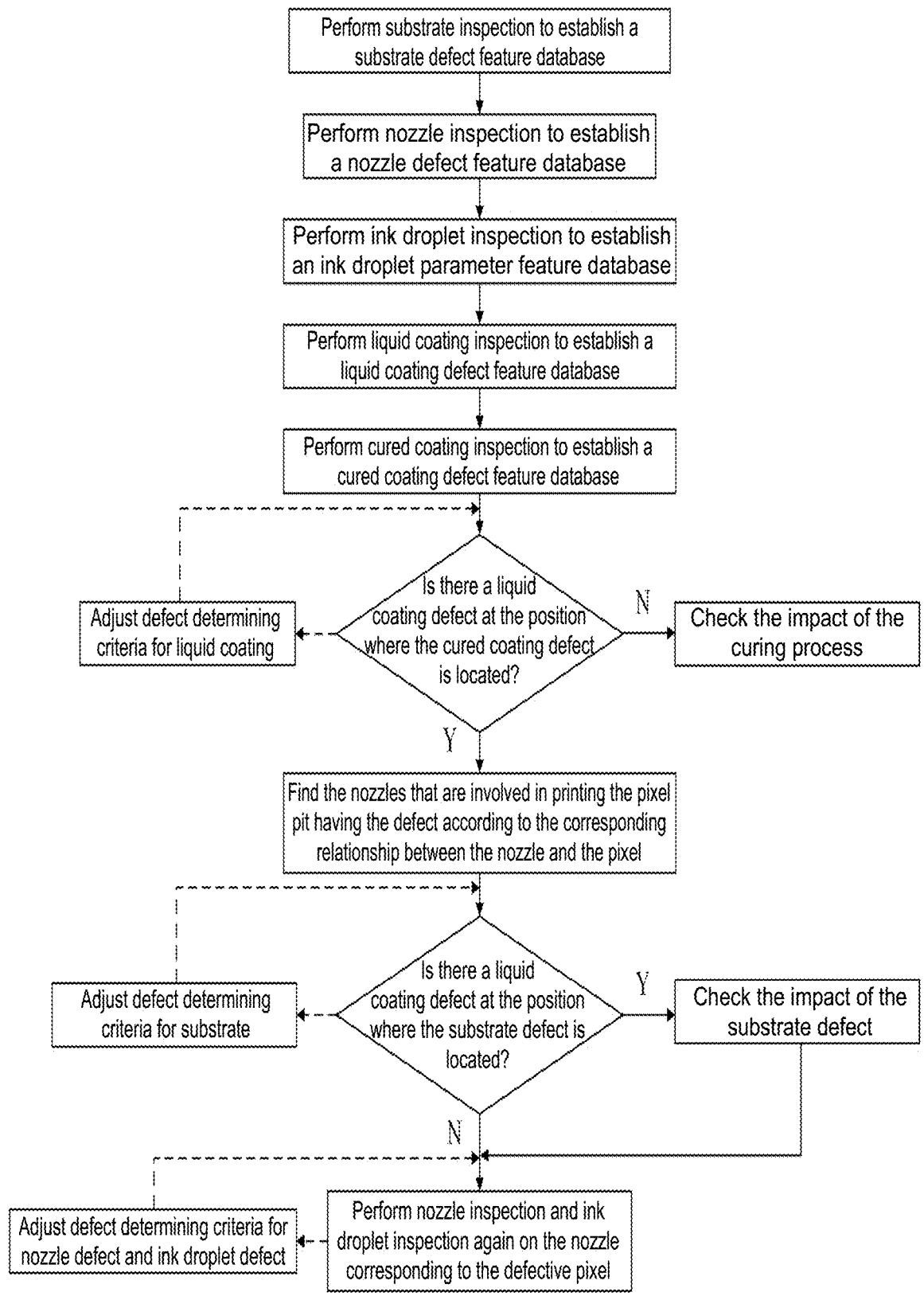
FIG. 9 is a schematic view of a closed-loop for inspection on substrates, nozzles, ink droplets, liquid coating, and cured coating in a preferred embodiment of the disclosure.

In addition, as exemplarily shown in FIG. 9, according to another preferred embodiment of the disclosure, the step of forming the inspection closed-loop between the substrate, the nozzle, the ink droplet, the liquid coating and the cured coating preferably includes the following operation steps.

For the collected substrate defect feature database, the nozzle defect feature database, the ink droplet parameter feature database, the liquid coating defect feature database and the cured coating defect feature database, these feature databases are compared to determine the source of the defects, and then the criteria for determining the substrate defects, the nozzle defects, the ink droplet defects, and the liquid coating defects are adjusted accordingly. Specifically, the operation of determining the source of the defect and adjusting the determining criteria accordingly is as follows. The liquid coating defect feature database and the cured coating defect feature database are compared. If there is no liquid coating defect at the cured coating defect, then it is determined that the defect originates from the curing process or the criteria for determining the liquid coating defects need to be set to a lower level. If there is a liquid coating defect, the inkjet printing process is further analyzed, and the nozzles that are involved in printing the pixel having the cured coating defect are searched. The substrate defect feature database and the liquid coating defect feature database are compared. If there is a substrate defect at the liquid coating defect, the impact of the substrate defect on the liquid coating defect is further investigated. If the substrate defect will cause the liquid coating defect, the threshold $C_{b0}$ for determining the substrate defect is set to be lower. If there is no substrate defect, it is determined that the defect originates from the spraying process or the criteria for determining the substrate defect needs to be set to a lower level, and the spraying process is further analyzed. The ink droplet parameter feature database is checked. If the ink droplets sprayed by the nozzle involved in printing the defective pixels are not defective, the threshold $C_{d0}$ for determining the ink droplet defects needs to be set to a lower level, otherwise the nozzle and ink droplet inspection closed-loop method are adopted to determine whether the defects originate from the nozzle. If the defect originates from a nozzle but the nozzle is not defective in the nozzle defect feature database, the threshold $C_{n0}$ for determining the nozzle defect is set to a lower level.

Figure 10:
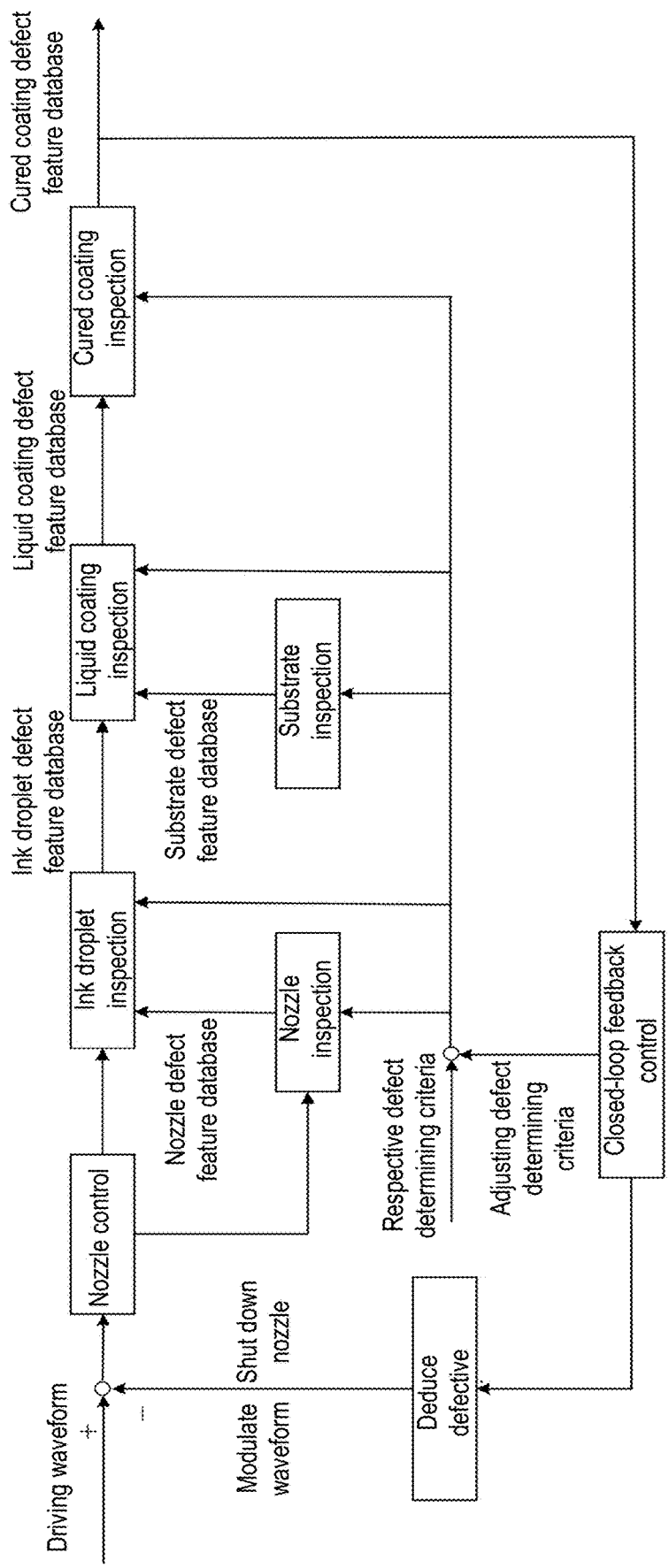
FIG. 10 is a schematic view of the quality closed-loop feedback control of the entire inkjet printing manufacturing process in a preferred embodiment of the disclosure.

Referring to FIG. 10, according to another preferred embodiment of the disclosure, the following method can be adopted to perform quality closed-loop feedback control in the entire inkjet printing manufacturing process. The driving waveform is set to control the nozzle to spray, the criteria for determining the defects of the substrate, the nozzle, the ink droplets, the liquid coating, and cured coating are set and corresponding inspection method is performed to inspect the substrate, the nozzle, the ink droplets, the liquid coating, and cured coating to form the corresponding defect feature databases and parameter feature databases. The source of defects is deduced according to the nozzle, the ink droplet inspection closed-loop as well as the substrate, the nozzle, the ink droplet, the liquid coating and the cured coating inspection closed-loop, and the determining criteria directed at the substrate defect, the nozzle defect, the ink droplet defect and the liquid coating defect are adjusted to reduce the missed inspection rate and false inspection rate of the defects. If the cured coating defect is caused by the nozzle defect, the defective nozzle is shut down; if the cured coating defect is caused by the driving waveform, the driving form is adjusted, thereby forming the closed-loop feedback control for the quality of the entire inkjet printing manufacturing process.

In summary, according to the quality inspection system and method for the entire inkjet printing manufacturing process provided in the disclosure, by designing multiple vision modules and control modules, as well as corresponding quality inspection algorithms, it is possible to achieve on-line quality inspection on the substrate, nozzle, ink droplet, liquid coating and cured coating. By comparing and analyzing the defect feature databases and parameter feature databases, the inspection results of each stage of the process can be verified and the defect determining criteria can be adjusted. Meanwhile, the source of defects in the inkjet printing manufacturing process can be analyzed. In this way, the systematic inspection and control of the quality of the entire inkjet printing manufacturing process can be realized.

Those skilled in the art can easily understand that the above descriptions are only preferred embodiments of the present disclosure and are not intended to limit the present disclosure. Any modification, equivalent replacement and improvement, etc. made within the spirit and principle of the present disclosure should fall within the protection scope of the present disclosure.

What is claimed is:

1. A method for quality inspection on an entire inkjet printing manufacturing process for display devices, wherein the method comprises the following steps:
    (a) using a substrate inspection module to perform a positioning inspection and a visual quality inspection on a substrate before an inkjet printing, and recording and establishing a substrate defect feature database and a substrate defect distribution map;
    (b) using a nozzle inspection module to perform the positioning inspection and the visual quality inspection on a print head that performs the inkjet printing, and recording and establishing a nozzle defect feature database;
    (c) using an ink droplet inspection module to perform a real-time visual inspection on volume, the velocity, an angle and a shape of flying ink droplets that is sprayed by the print head, and recording and establishing an ink droplet parameter feature database;
    (d) using the substrate inspection module and a coating thickness inspection module to perform a visual inspection on a quality of a liquid coating and the thickness of the liquid coating sprayed onto the substrate, and recording and establishing a liquid coating defect feature database and a liquid coating defect distribution map;
    (e) using the substrate inspection module and the coating thickness inspection module again to perform the visual inspection on the quality of a cured coating and the thickness of the cured coating that are sprayed onto the substrate and completely cured, and recording and establishing a cured coating defect feature database and a cured coating defect distribution map;
    (f) setting defect determining criteria for the substrate, nozzles, ink droplets, the liquid coating, and the cured coating in advance, and forming an inspection closed-loop between the nozzles and the ink droplets as well as an inspection closed-loop between the substrate, the nozzles, the ink droplets, the liquid coating and the cured coating according to multiple defect feature databases and parameter feature databases respectively formed in the above steps; then, deducing and determining a specific source of defect based on a cured coating defect and performing a corresponding optimal modulation, in order to realize a quality closed-loop feedback control of the entire inkjet printing manufacturing process.

2. The method according to claim 1, wherein the step (a) further comprises the following operation steps:
    (a1) activating the substrate inspection module, using a large-field downward-view unit first to find at least two positioning marks on the substrate, and then switching the large-field downward-view unit to the high-magnification downward-view unit for performing position inspection on the positioning marks, thereby calculating an installation position and a tilt angle of the substrate;
    (a2) the substrate moves sequentially to the preset marked position along a direction $X_1$, that is, the first horizontal lateral direction, in the meantime, the high-resolution vision unit collects images of the substrate, after the movement in the direction $X_1$ is completed, the high-resolution vision unit moves for a predetermined distance along a direction $Y_1$, that is, the first horizontal longitudinal direction, and then the substrate moves reversely in the direction $X_1$, in this way, the substrate and the high-resolution vision unit move alternately until the images of the entire substrate are collected, in the process, it is ensured that there is a certain overlap area in the adjacent images obtained from each collecting;
    (a3) obtaining the complete substrate image by stitching adjacent images, and image processing is performed on the image to establish the substrate defect feature database and the substrate defect distribution map, then a substrate defect determining index $C_b$ is calculated according to the following formula (1), wherein when $C_b$ is greater than a preset threshold $C_{b0}$, it is determined that the substrate is a defective substrate;

$$C_b = \sum_{i=1}^{N} b_i \left( \sum_{j=1}^{N_i} \left( \frac{D_j}{T_i} - 1 \right) \right) \quad \text{formula (1)}$$

in the formula (1), N represents the number of defect categories of the substrate; $T_i$, $N_i$, $b_i$ respectively represent a threshold for determining the defect, the number of defects and a weighting coefficient in the i-th category; $D_j$ represents the measured defect feature parameter and $D_j > T_i$; i and j respectively represent integers of 1 to N and 1 to $N_i$.

3. The method according to claim 1, wherein the step (b) further comprises the following operation steps:
    (b1) activating the nozzle inspection module, using the large-field upward-view unit first to find at least two positioning marks of the print head, then, switching the large-field upward-view unit to the high-magnification upward-view unit for performing position inspection on the positioning marks, thereby calculating an initial position of the nozzles;
    (b2) the high-magnification upward-view unit collects an image of each of nozzle areas and obtains a nozzle contour information comprising contour points, then measure a nozzle size and calculate a nozzle defect index $C_n$ according to the following formula (2), wherein when $C_n$ is greater than a preset threshold $C_{n0}$, it is determined that the nozzles are defective:

$$C_n = \gamma_1 \frac{1}{N} \sum_{i=1}^{N} \left| \sqrt{(x_i - x_0)^2 + (y_i - y_0)^2} - r \right| + \gamma_2 \left( \max\left(\sqrt{(x_i - x_0)^2 + (y_i - y_0)^2}\right) - \min\left(\sqrt{(x_i - x_0)^2 + (y_i - y_0)^2}\right) \right) \quad \text{formula (2)}$$

in the formula (2), N represents the number of the contour points, $x_i$ and $y_i$ respectively represent position coordinates of the contour point numbered i, and the value of i is an integer from 1 to N; γ1 and γ2 are preset weighting coefficients respectively; $x_0$ and $y_0$ respectively represent position coordinates of a center point of the nozzles; x and y respectively represent position coordinates of any one of the contour points; r represents a radius of a circle corresponding to the nozzles.

4. The method according to claim 1, wherein the step (c) comprises the following operation steps:

(c1) activating the ink droplet inspection module, and synchronously triggering the two sets of horizontal vision units to collect images of the flying ink droplets at multiple timings in a strobe mode, until the inspection on the flying ink droplets from all of the nozzles is completed;

(c2) performing stereo calibration and image processing on the image of the flying ink droplets, then classifying shapes of the ink droplets, and simultaneously measuring a series of ink droplet parameters such as the volume, the velocity, and the angle, calculating an ink droplet defect index $C_d$ according to the following formula (3), wherein when $C_d$ is greater than a preset threshold $C_{d0}$, it is determined that the ink droplets are defective ink droplets:

$$C_d = d_1 \left| \frac{V}{V_0} - 1 \right| + d_2 \left| \frac{v}{v_0} - 1 \right| + d_3 \left| \frac{\varphi}{\varphi_0} - 1 \right| + d_4 \left| \frac{\theta}{\theta_0} - 1 \right| \quad \text{formula (3)}$$

in the formula (3), $V_0$, $v_0$, $\varphi_0$, and $\theta_0$ respectively represent a preset ink droplet volume threshold, a velocity threshold, and two angle thresholds; $d_1$, $d_2$, $d_3$, and $d_4$ respectively represent the preset weighting coefficients; V represents an actual measured volume of the flying ink droplets, v represents an actual measured velocity of the flying ink droplets; $\varphi$ and $\theta$ represent the actual measured azimuth and a pitch angle of the flying ink droplets.

5. The method according to claim 4, wherein in sub-step (c2), an actual volume V of the flying ink droplets are measured through the following process:

respectively obtaining by the two sets of horizontal vision units for the images of the flying ink droplets, aligning the two contours in height, and using a third order Hermite curve interpolation to construct a closed curve represented by the following formula (4) according to four of the contour points in the same height plane;

calculating an enclosed area S of the constructed closed curve, and calculating the actual volume V of the flying ink droplets according to the following formulas (5) and (6) through a volume integration method:

$$H(x) = y_1\left(1 + 2\frac{x - x_1}{x_2 - x_1}\right)\left(\frac{x - x_2}{x_1 - x_2}\right)^2 + y_2\left(1 + 2\frac{x - x_2}{x_1 - x_2}\right)\left(\frac{x - x_1}{x_2 - x_1}\right)^2 + y_1'(x - x_1)\left(\frac{x - x_2}{x_1 - x_2}\right)^2 + y_2'(x - x_2)\left(\frac{x - x_1}{x_2 - x_1}\right)^2 \quad \text{formula (4)}$$

$$S = -k_1 \int_{x_1}^{x_2} H_1(x)dx - k_2 \int_{x_2}^{x_3} H_2(x)dx + k_3 \int_{x_3}^{x_4} H_3(x)dx + k_4 \int_{x_4}^{x_1} H_4(x)dx \quad \text{formula (5)}$$

$$V = \Delta h \sum S_i \quad \text{formula (6)}$$

wherein H(x) represents a structure curve between two of the contour points, and four segments of curves $H_1$, $H_2$, $H_3$, and $H_4$ are constructed between four of the contour points in the same height plane; $(x_1, y_1)$ and $(x_2, y_2)$ respectively represent coordinate values of two of the contour points, which are adjacent, that construct the Hermite curve; $y_1'$ and $y_2'$ respectively represent derivatives at the point $(x_1, y_1)$ and $(x_2, y_2)$; $k_1$, $k_2$, $k_3$, $k_4$ respectively represent correction coefficients for correcting an error of an ink droplet contour approximately represented by the Hermite curve; $\Delta h$ represents a height between the adjacent height planes; $S_i$ represents the area enclosed by the closed curve in the i-th height plane.

6. The method according to claim 1, wherein the step (d) comprises the following operation steps:

(d1) sequentially moving the substrate after the inkjet printing to the preset marked position according to the position feedback along the direction $X_1$, that is, the first horizontal lateral direction, in the meantime, the high-resolution vision unit collects the image of the current substrate, after the movement in the direction $X_1$ is completed, the high-resolution vision unit moves for a preset distance along the direction $Y_1$, that is, the first horizontal longitudinal direction, and then the substrate moves reversely in the direction $X_1$, in this manner, the high-resolution vision unit and the substrate move alternately until the image of the liquid coating is completely collected, in this process, it should be ensured that there is a certain overlap area in the adjacent images obtained from each image collection;

(d2) obtaining a complete liquid coating substrate image by stitching adjacent images, performing background subtraction and image processing on the obtained image, and establishing the liquid coating defect feature database and the liquid coating defect distribution map;

(d3) activating the coating thickness inspection module to perform scanning along the direction $Z_1$, that is, the first vertical direction, so as to collect a series of interference fringe images at each height position and record the corresponding vertical position value, calculate the liquid coating thickness distribution and a liquid coating volume according to a white light interference principle;

(d4) calculating a local uniformity index $U_{local}$ of the liquid coating and a global uniformity index $U_{global}$ of the liquid coating according to the following formulas (7) and (8), and an inkjet printing quality is assessed based on these two indexes:

$$U_{local} = \frac{S_h}{S_{local}} \quad \text{formula (7)}$$

$$U_{global} = \frac{1}{K}\sum_{k=1}^{K} U_k, \; U_k = \begin{cases} 0, & \frac{|h_{c,k} - \overline{h}|}{\overline{h}} > \lambda_2 \\ U_k, & \frac{|h_{c,k} - \overline{h}|}{\overline{h}} \leq \lambda_2 \end{cases} \quad \text{formula (8)}$$

in the above formulas, $S_{local}$ represents an area of a defined region of interest of the liquid coating substrate inspection image; $S_h$ represents an area of the region of which a thickness h satisfies $$\frac{|h - h_c|}{h_c} \leq \lambda_1$$

and which begins to be searched from a center of the region of interest, wherein $h_c$ represents a center thickness of the region of interest; $\lambda_1$ represents a preset local uniformity coefficient of the liquid coating, $\lambda_2$ represents a preset global uniformity coefficient of the liquid coating; K represents the number of regions of interest determined by sampling when calculating the global uniformity; $h_{c,k}$ and $U_k$ respectively represent the central thickness and local uniformity of the k-th region of interest, wherein the value of k is an integer from 1 to K; $\overline{h}$ represents an average value of the center thickness of the liquid coating of the K regions of interest.

7. The method according to claim 1, wherein the step (e) comprises the following operation steps:
   (e1) sequentially moving the substrate after the inkjet printing and curing to the preset marked position according to the position feedback along the direction $X_1$, that is, the first horizontal lateral direction, in the meantime, the high-resolution vision unit collects the image of the current substrate, after the movement in the direction $X_1$ is completed, the high-resolution vision unit moves for the preset distance along the direction $Y_1$, that is, the first horizontal longitudinal direction, and then the substrate moves reversely in the direction $X_1$, in this manner, the high-resolution vision unit and the substrate move alternately until the image of the cured coating is completely collected, in this process, it should be ensured that there is a certain overlap area in the adjacent images obtained from each image collection;
   (e2) obtaining a complete cured coating substrate image by stitching adjacent images, perform background subtraction on the obtained image, and establishing the cured coating defect feature database and the cured coating defect distribution map;
   (e3) activating the coating thickness inspection module to perform scanning along the direction $Z_1$, which is the first vertical direction, so as to collect the series of interference fringe images at each height position and record the corresponding vertical position value, calculating the cured coating thickness distribution and a cured coating volume according to the white light interference principle;
   (e4) calculating the local uniformity index $U_{local}$ of the cured coating and the global uniformity index $U_{global}$ of the cured coating according to the following formulas (9) and (10), and assessing the quality after an inkjet printing curing based on these two indexes:

$$U_{local} = \frac{S_h}{S_{local}} \quad \text{formula (9)}$$

$$U_{global} = \frac{1}{K}\sum_{k=1}^{K} U_k, \; U_k = \begin{cases} 0, & \frac{|h_{c,k} - \overline{h}|}{\overline{h}} > \mu_2 \\ U_k, & \frac{|h_{c,k} - \overline{h}|}{\overline{h}} \leq \mu_2 \end{cases} \quad \text{formula (10)}$$

wherein in the above formulas, $S_{local}$ represents the area of the defined region of interest of in cured coating substrate inspection image; $S_h$ represents the area of the region of which the thickness h satisfies $$\frac{|h - h_c|}{h_c} \leq \mu_1$$

and which begins to be searched from the center of the region of interest, wherein $h_c$ represents the center thickness of the region of interest; $\mu_1$ represents the preset local uniformity coefficient of the cured coating, $\mu_2$ represents the preset global uniformity coefficient of the cured coating; K represents the number of regions of interest determined by sampling when calculating the global uniformity; $h_{c,k}$ and $U_k$ respectively represent the central thickness and the local uniformity of the k-th region of interest, wherein the value of k is an integer from 1 to K; $\overline{h}$ represents the average value of the center thickness of the cured coating of the K regions of interest.

8. The method according to claim 1, wherein the step (f) of forming the
   quality closed-loop feedback control of the entire ink printing manufacturing process comprises the following operation steps:
   (f1) setting the driving waveform is set to control the nozzles to spray;
   (f2) setting the criteria for determining the defects of the substrate, the nozzles, the ink droplets, the liquid coating, and cured coating and performing a corresponding quality inspection;
   (f3) deducing the source of the defects according to the nozzles, the ink droplet inspection closed-loop as well as the substrate, the nozzles, the ink droplets, the liquid coating and a cured coating inspection closed-loop,
   (f4) adjusting defect determining criteria in the corresponding stage to reduce a missed inspection rate and a false inspection rate of the defects.

* * * * *